(12) United States Patent
Hoshi

(10) Patent No.: US 12,205,922 B2
(45) Date of Patent: Jan. 21, 2025

(54) SEMICONDUCTOR CIRCUIT DEVICE

(71) Applicant: FUJI ELECTRIC CO., LTD., Kawasaki (JP)

(72) Inventor: Yasuyuki Hoshi, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 351 days.

(21) Appl. No.: 17/587,687

(22) Filed: Jan. 28, 2022

(65) Prior Publication Data
US 2022/0157778 A1 May 19, 2022

Related U.S. Application Data

(63) Continuation of application No. PCT/JP2020/049244, filed on Dec. 28, 2020.

(30) Foreign Application Priority Data

Feb. 14, 2020 (JP) ................. 2020-023739

(51) Int. Cl.
*H01L 25/065* (2023.01)
*H01L 23/00* (2006.01)

(52) U.S. Cl.
CPC .......... *H01L 25/0655* (2013.01); *H01L 24/06* (2013.01); *H01L 24/16* (2013.01);
(Continued)

(58) Field of Classification Search
None
See application file for complete search history.

(56) References Cited

U.S. PATENT DOCUMENTS 10,355,084 B1 7/2019 Nishi et al.
2011/0297964 A1* 12/2011 Miura ................. H01L 29/7815
257/E27.06
(Continued)

FOREIGN PATENT DOCUMENTS

JP 2011-254387 A 12/2011
JP 2014-120638 A 6/2014
(Continued)

OTHER PUBLICATIONS

International Search Report for PCT/JP2020/049244, issued on Mar. 30, 2021.
(Continued)

*Primary Examiner* — Cory W Eskridge
(74) *Attorney, Agent, or Firm* — Rabin & Berdo, P.C.

(57) ABSTRACT

A layout of electrode pads on a front surface of a first semiconductor chip is different from a layout of them on a second semiconductor chip. An overall layout of the semiconductor chips mounted on the insulated substrate and the layouts of the electrode pads on the front surfaces of the semiconductor chips including the first and second semiconductor chips are determined so that a value of a resistance component and/or a value of a reactance component between each two electrode pads that are the same type respectively on different semiconductor chips and are connected in parallel become the same. As a result, current waveform oscillation between semiconductor devices fabricated on the semiconductor chips, respectively, may be suppressed.

7 Claims, 18 Drawing Sheets

(52) U.S. Cl.
CPC .... *H01L 24/48* (2013.01); *H01L 2224/06177* (2013.01); *H01L 2224/16225* (2013.01); *H01L 2224/48225* (2013.01)

(56) References Cited

U.S. PATENT DOCUMENTS

| | | |
|---|---|---|
| 2016/0099194 A1 | 4/2016 | Gohara et al. |
| 2016/0365307 A1 | 12/2016 | Miyakoshi |
| 2018/0204910 A1* | 7/2018 | Mitamura .......... H01L 29/66348 |
| 2021/0280556 A1* | 9/2021 | Kato ................ H01L 23/49844 |

FOREIGN PATENT DOCUMENTS

| | | |
|---|---|---|
| JP | 2017-005094 A | 1/2017 |
| JP | 2018-117025 A | 7/2018 |
| JP | 2019-149477 A | 9/2019 |
| WO | 2015/093169 A1 | 6/2015 |

OTHER PUBLICATIONS

Written Opinion of the International Searching Authority for PCT/JP2020/049244, issued on Mar. 30, 2021.

* cited by examiner

<EXAMPLE>

<CONVENTIONAL EXAMPLE>

SEMICONDUCTOR CIRCUIT DEVICE

CROSS REFERENCE TO RELATED APPLICATIONS

This is a continuation application of International Application PCT/JP2020/049244 filed on Dec. 28, 2020 which claims priority from a Japanese Patent Application No. 2020-023739 filed on Feb. 14, 2020, the contents of which are incorporated herein by reference.

BACKGROUND OF THE INVENTION

1. Field of the Invention

Embodiments of the invention related to a semiconductor circuit device.

2. Description of the Related Art

Conventionally, a power module or an intelligent power module (IPM) is used in, for example, inverter devices, uninterruptible power supply (UPS) equipment, machine tools, industrial robots, railway systems, railroad vehicles (trains), hybrid electric vehicles (HEVs), and battery electric vehicle (BEVs).

A power module is an integrated circuit (IC) in which electronic circuits and electronic components including power semiconductor devices are integrated. An IPM is an IC in which a power semiconductor device and driving/protective circuits of the power semiconductor device are integrated on a single insulated circuit. A power semiconductor device is a power control semiconductor device that controls high voltages and/or large currents and performs power conversion (conversion of a physical quantity such as voltage, current, frequency, etc. into another physical quantity), rectification, etc.

There are various types of power semiconductor devices such as, for example, bipolar transistors, insulated gate bipolar transistors (IGBTs), metal oxide semiconductor field effect transistors (MOSFETs) having an insulated gate with a 3-layer structure including a metal, an oxide film and a semiconductor, and these are selectively used according an intended application.

For example, bipolar transistors and IGBTs have high current density compared to MOSFETs and can be adapted for large current but cannot be switched at high speeds. In particular, the limit of switching frequency is about several kHz for bipolar transistors and about several tens of kHz for IGBTs. On the other hand, MOSFETs have low current density compared to bipolar transistors and IGBTs and are difficult to adapt for large current but can be switched at high speeds up to about several MHz.

Silicon (Si) is used as a material for fabricating power semiconductor devices. There is a strong demand in the market for large-current, high-speed power devices and efforts have been poured into the improvement of silicon IGBTs and power MOSFETs; at present, development has nearly reached the theoretical limit determined by silicon. Therefore, semiconductor materials to replace silicon have been investigated from the perspective of power semiconductor devices and silicon carbide (SiC) has been attracting attention as a semiconductor material that can be used for fabricating (manufacturing) next generation power semiconductor devices having a low ON voltage with favorable high-speed characteristics and high-temperature characteristics.

Silicon carbide is a very stable material chemically, has a wide band gap of 3 eV, and can be used very stably as a semiconductor even under high temperatures. Further, silicon carbide has a critical electric field strength that is at least ten times that of silicon and therefore, is expected as a semiconductor material that can sufficiently reduce ON resistance. Such characteristics of silicon carbide are common to all semiconductors having a band gap wider than that of silicon (hereinafter, wide band gap semiconductors) and are not limited to silicon carbide.

Further, to accommodate larger currents, a trench gate structure in which a channel is formed along sidewalls of a gate trench in a direction orthogonal to a front surface of the semiconductor chip is advantageous in terms of cost as compared to an instance in which a device element structure of a power semiconductor device has planar gate structure in which a channel (inversion layer) is formed along the front surface of the semiconductor chip. A reason for this is that a trench gate structure enables unit cell (constituent unit of a device element) density per unit area to be increased, whereby current density per unit area may be increased.

A rate of temperature rise corresponding to a volume occupied by the unit cells increases by an extent to which the current density per unit area increases and therefore, to enhance discharge efficiency and stabilize reliability, a double-sided cooling structure is necessary. Furthermore, a power semiconductor device has been proposed that enhances reliability by having a high-function structure in which, on a single semiconductor chip having a main semiconductor device element that performs a main operation of a power semiconductor device, a current sensing portion, a temperature sensing portion, and an over-voltage protecting portion are disposed as circuit portions for protecting and controlling the main semiconductor device element.

A structure of a conventional semiconductor circuit device is described taking, as an example, an IPM in which multiple semiconductor chips having a power semiconductor device fabricated therein are integrated on an insulated substrate further and on the same semiconductor chip having the power semiconductor device, a main semiconductor device element, a current sensing portion, and a temperature sensing portion are provided. FIG. 21 is a plan view schematically depicting a layout when the conventional semiconductor circuit device is viewed from a front side of the insulated substrate. FIG. 22 is a cross-sectional view schematically depicting the structure of the conventional semiconductor circuit device. FIG. 22 depicts a cross-section of the structure of a semiconductor circuit device 200 in FIG. 21.

The conventional the semiconductor circuit device 200 depicted in FIGS. 21 and 22 includes semiconductor chips 210, an insulated substrate 220, a printed circuit board 230, and external electrode terminals 228a, 228b. In the insulated substrate 220, a copper (Cu) plate 222 and a heat dissipating plate 223 are bonded to main surfaces of an insulating plate 221, respectively. The semiconductor chips 210 are mounted on the copper plate 222 of the insulated substrate 220. In each of the semiconductor chips 210, a vertical MOSFET constituting a main semiconductor device element, and a current sensing portion and a temperature sensing portion constituting high-function portions are fabricated.

All the semiconductor chips 210 have the same configuration and include, at the front surface, multiple electrode pads in a same layout. The electrode pads of the front surface of each of the semiconductor chips 210 include electrode pads (a source pad 211a and a gate pad 211b) of the main semiconductor device element, an electrode pad (hereinafter, OC pad) 212 of the current sensing portion, and electrode pads (an anode pad 213a and cathode pad 213b) of the temperature sensing portion, while an electrode pad of a back surface is a drain pad (not depicted) of the main semiconductor device element and the current sensing portion.

A layout when the electrode pads of the respective front surfaces of the semiconductor chips 210 are viewed from the front surface (main surface having the copper plate 222) of the insulated substrate 220 is the same of all (here, four (4)) the semiconductor chips 210 mounted on the insulated substrate 220. For example, each of the semiconductor chips 210 has a substantially rectangular shape in a plan view and along one side thereof, the gate pad 211b, the OC pad 212, the anode pad 213a, and the cathode pad 213b corresponding thereto are arranged in a single row. Further, the source pad 211a covers a majority of the front surface of the semiconductor chip 210 and faces all of the other electrode pads 211b, 212, 213a, 213b.

The semiconductor chips 210 are arranged at equal intervals in a single row. When viewed from the front surface of the insulated substrate 220, orientation of all the semiconductor chips 210 is uniform so that, in a direction along which the semiconductor chips 210 are arranged in a row, a same metal pattern formed by the electrode pads on the front surface of one of the semiconductor chips 210 is disposed regularly repeating for the number of the semiconductor chips 210. In each of the semiconductor chips 210, multiple implant pins (conductive posts) 226 are bonded to the source pad 211a via a solder layer 225.

In each of the semiconductor chips 210, different implant pins (conductive posts) 227 are bonded to the gate pad 211b, the OC pad 212, the anode pad 213a, and the cathode pad 213b, respectively. The implant pins 226, 227 penetrate through the printed circuit board 230 that faces the front surfaces of the semiconductor chips 210, and the implant pins 226, 227 are directly bonded to a predetermined electrode pad formed on a first main surface of the printed circuit board 230, opposite to a second main surface thereof facing the semiconductor chips 210 or are electrically connected thereto via a circuit pattern (not depicted).

For example, in each of the semiconductor chips 210, the source pad 211a is electrically connected to a single source pad 231a of the printed circuit board 230, via the implant pins 226. In each of the semiconductor chips 210, the gate pad 211b, the OC pad 212, the anode pad 213a, and the cathode pad 213b are electrically connected to a corresponding gate pad 231b, a corresponding OC pad 232, a corresponding anode pad 233a, and a corresponding cathode pad 233b of the printed circuit board 230 via the different implant pins 227, respectively.

On the printed circuit board 230, for example, the source pad 231a of the printed circuit board 230 is disposed at a position facing all the source pads 211a of the semiconductor chips 210. The gate pads 231b, the OC pads 232, the anode pads 233a and the cathode pads 233b of the printed circuit board 230 are disposed for each of the semiconductor chips 210 mounted on the insulated substrate 220 and, for example, are disposed on the printed circuit board 230 at positions facing the semiconductor chip 210 connected thereto.

In FIG. 21, the source pads 211a, 231a, the gate pads 211b, 231b, the OC pads 212, 232, the anode pads 213a, 233a, and the cathode pads 213b, 233b are indicated as rectangular shapes appended with "S", "G", "OC", "A", and "K", respectively. Further, to clarify arrangement of the semiconductor chips 210, a portion where the source pad 231a of the printed circuit board 230 is disposed is depicted above the semiconductor chips 210 and a portion where electrode pads other than the source pad 231a are disposed is depicted below the semiconductor chips 210.

The gate pads 231b of the printed circuit board 230 are electrically connected to one another via wiring 234. The source pads 211a on the front surfaces of the semiconductor chips 210 are electrically connected to the source pad 231a of the printed circuit board 230 by the implant pins 226 while the drain pad of the back surface is bonded to the copper plate 222 of the later-described insulated substrate 220, whereby the main semiconductor device elements (MOSFETs) of the semiconductor devices fabricated on the semiconductor chips 210, respectively, are connected in parallel.

A first end of each of the external electrode terminals 228a is bonded to the copper plate 222 of the front surface of the insulated substrate 220. The electrode pads of the back surface of the semiconductor chips 210 are bonded to the copper plate 222 of the front surface of the insulated substrate 220 via solder layers 224 and are electrically connected to the external electrode terminals 228a via the copper plate 222. A first end of the external electrode terminal 228b is bonded to a circuit pattern (not depicted) of the printed circuit board 230. Second ends of the external electrode terminals 228a, 228b protrude outward from a later-described sealing material 229.

The insulated substrate 220, the semiconductor chips 210, the implant pins 226, 227, the printed circuit board 230, and the external electrode terminals 228a, 228b are sealed by the sealing material 229. The heat dissipating plate 223 of the insulated substrate 220 is bonded to a cooling device (not depicted) via a thermal conductive paste. During operation of the semiconductor circuit device 200, heat generated by the circuit pattern of the printed circuit board 230 of the semiconductor chips 210 is transferred and dissipated from the insulated substrate 220 to the cooling device, whereby the semiconductor chips 210 and the printed circuit board 230 are cooled. Reference numeral 235 is a control portion that controls a high-function portion.

As one conventional semiconductor circuit device, a semiconductor module has been proposed in which multiple semiconductor chips are mounted in a single row on an insulated substrate and semiconductor devices fabricated, respectively, on these semiconductor chips are connected in parallel (for example, refer to Japanese Laid-Open Patent Publication No. 2017-005094 and International Publication No. WO 2015/093169). In Japanese Laid-Open Patent Publication No. 2017-005094, MOSFETs fabricated, respectively, on the semiconductor chips having silicon carbide as a semiconductor material are connected to one another in parallel via implant pins. International Publication No. WO 2015/093169 discloses that multiple electrode pads are provided on each of the semiconductor chips.

SUMMARY OF THE INVENTION

According to an embodiment of the invention, a semiconductor circuit device includes: a first substrate; a plurality of semiconductor chips bonded to the first substrate, separate from one another and containing a semiconductor having a band gap wider than that of silicon, each semiconductor chip having: a plurality of types of semiconductor device elements, and one pad set of electrode pads disposed on a front surface of said each semiconductor chip, the one pad set including a plurality of types of electrode pads that are disposed separately from one another, an electrode pad of each type in the one pad set being electrically connected to an electrode pad of the same type in one pad set on each of the rest of the plurality of semiconductor chips, said each type of electrode pad in the one pad set corresponding to one of the plurality of types of semiconductor device elements; and a plurality of metal members each connecting the electrode pads of the same type in the respective one pad sets in parallel. The plurality of semiconductor chips includes a first semiconductor chip and a second semiconductor chip. The plurality of the electrode pads of the one pad set on the first semiconductor chip is arranged on the front surface of the first semiconductor chip in a first pad layout that is different in a plan view of the semiconductor circuit device from a second pad layout in which the plurality of electrode pads of the one pad set is arranged on the front surface of the second semiconductor chip. The plurality of semiconductor chips is arranged on the first substrate in a chip layout. The first pad layout, the second pad layout and the chip layout are set so that a value of a resistance component and/or a value of a reactance component between any two electrode pads of a same type, which are connected in parallel via the metal members and respectively disposed on an adjacent two of the semiconductor chips that are adjacent to each other, are the same as one another.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
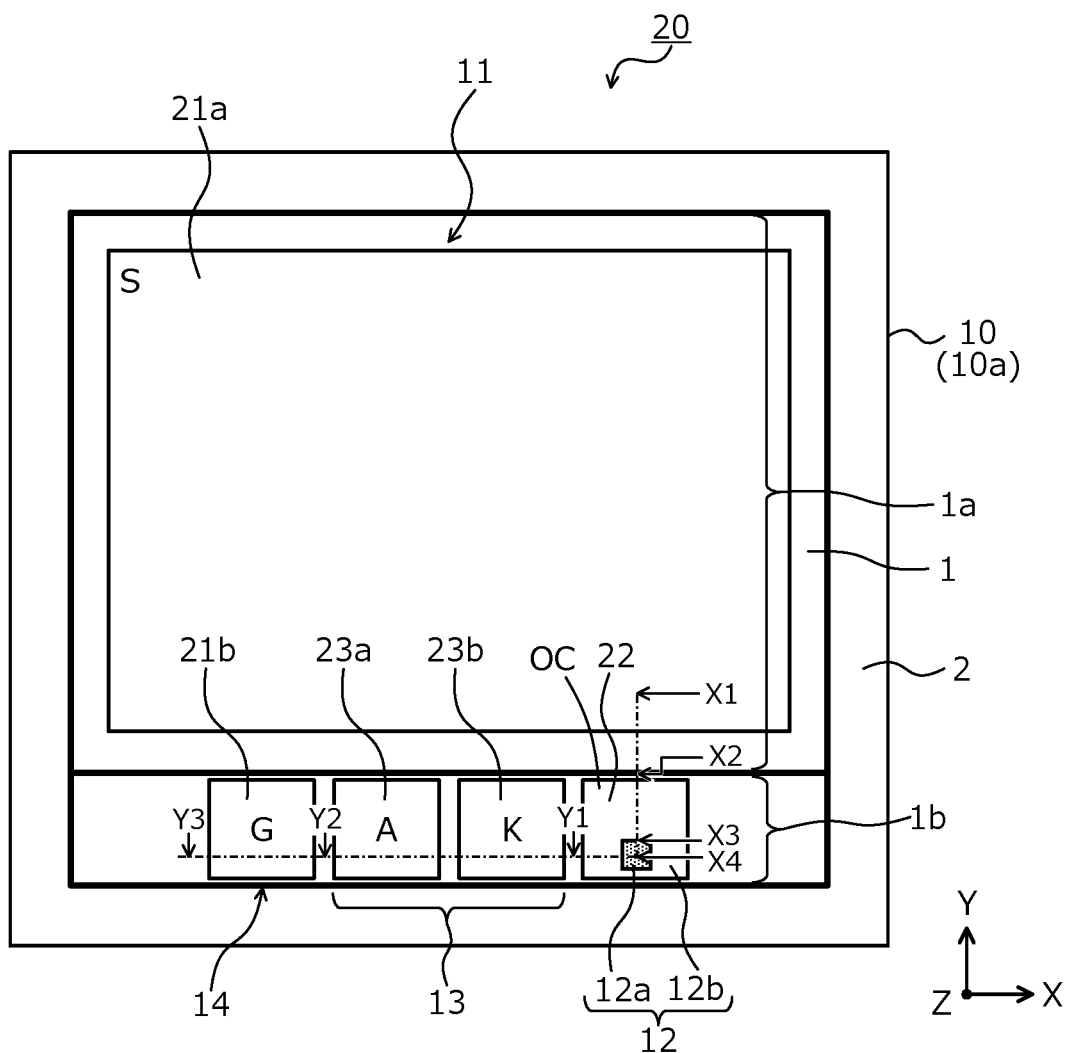
FIG. 1 is a plan view depicting an example of a layout (pad layout, chip layout) when semiconductor chips mounted on an insulated substrate of a semiconductor circuit device according to a first embodiment are viewed from a front side of a semiconductor device 20.

First, problems associated with the conventional techniques are discussed. In the conventional semiconductor circuit device 200 (refer to FIGS. 21 and 22), when the number of main semiconductor device elements (MOSFETs) connected in parallel is increased to accommodate larger currents, the number of the semiconductor chips 210 mounted on the insulated substrate 220 increases. As a result, the mounting area (surface area) of the insulated substrate 220 increases and a routing length of the wiring 234 increases for connecting, in parallel, the MOSFETs fabricated, respectively, on the semiconductor chips 210 arranged in a single row.

Therefore, as the number of the main semiconductor device elements connected in parallel increases, resistance (R) components and reactance (L) of the wiring 234 are adversely affected, a voltage waveform 143 of the gate voltage Vg of each of the MOSFETs fabricated on the semiconductor chips 210 oscillates, and the gate threshold voltage Vth varies. As a result, a rising edge of a voltage waveform of the drain-source voltage Vds when each of the MOSFETs turns OFF becomes different.

The rising edge of the voltage waveform of the drain-source voltage Vds when each of the MOSFETs fabricated on the semiconductor chips 210 turns OFF becomes different, whereby a voltage waveform 142 of the drain-source voltage Vds when the semiconductor circuit device 200 turns OFF becomes susceptible to oscillation. As a result, a current waveform 141 of the drain-source current Ids when the semiconductor circuit device 200 turns OFF also becomes susceptible to oscillation (refer to later-described FIG. 20).

In an instance in which silicon carbide is used as a semiconductor material, faster switching operation of the MOSFETs becomes possible, whereby the wiring 234 becomes more susceptible to adverse effects and variation of the rising edge of the voltage waveform 142 of the drain-source voltage Vds during turn OFF further increases for each of MOSFETs fabricated on the semiconductor chips 210. Therefore, oscillation of the current waveform 141 of the drain-source current Ids of the semiconductor circuit device 200 further increases.

Accordingly, to suppress the oscillation of the current waveform 141 of the drain-source current Ids of the semiconductor circuit device 200, an external circuit is necessary, whereby the semiconductor circuit device 200 may increase in size and/or cost. Further, the current waveform 141 of the drain-source current Ids of the semiconductor circuit device 200 oscillates, thereby leading to erroneous operation or in a worst case, destruction of the semiconductor circuit device 200, etc., whereby reliability of the semiconductor circuit device 200 decreases.

Embodiments of a semiconductor circuit device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 2:
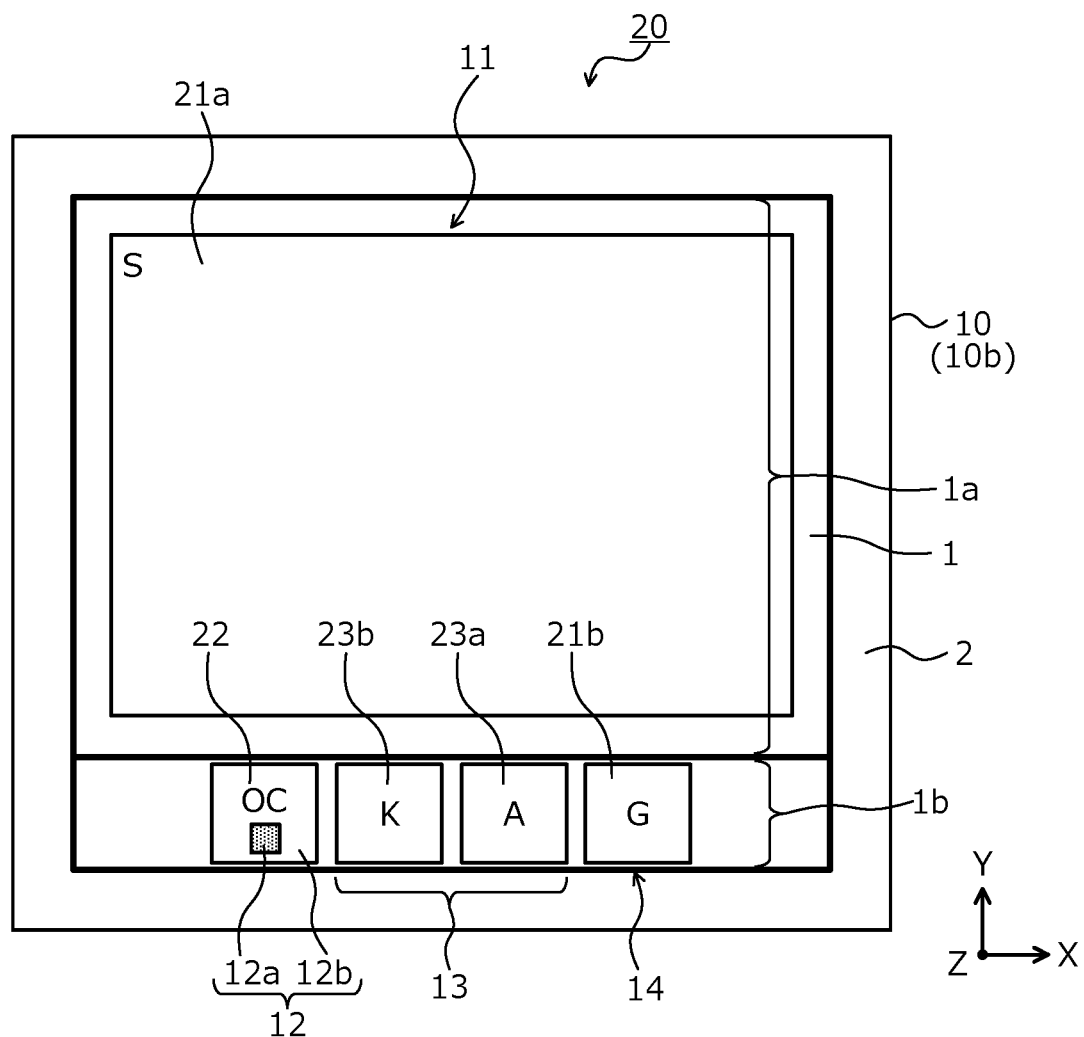
FIG. 2 is a plan view depicting an example of a layout (pad layout, chip layout) when the semiconductor chips mounted on the insulated substrate of the semiconductor circuit device according to the first embodiment are viewed from the front side of the semiconductor device 20.
Figure 3:
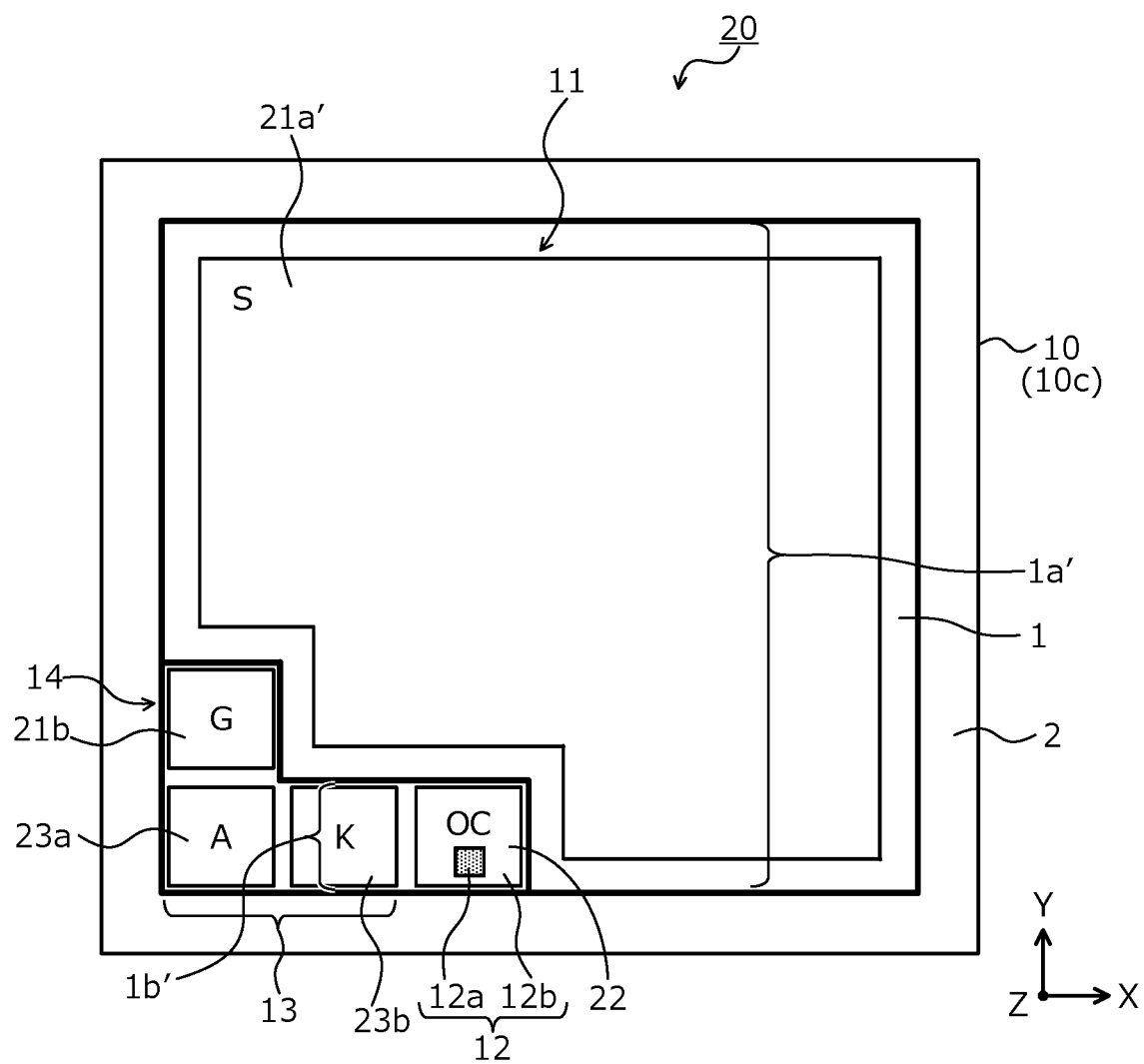
FIG. 3 is a plan view depicting an example of a layout (pad layout, chip layout) when the semiconductor chips mounted on the insulated substrate of the semiconductor circuit device according to the first embodiment are viewed from the front side of the semiconductor device 20.

A semiconductor circuit device according to a first embodiment is a power module or a IPM configured using, as a semiconductor material, a semiconductor (wide band gap semiconductor) having a band gap wider than that of silicon (Si). A structure of the semiconductor circuit device according to the first embodiment is described taking, as an example, an instance in which for example, silicon carbide (SiC) is used as a wide band gap semiconductor. FIGS. 1, 2, and 3 are plan views depicting examples of a layout when semiconductor chips mounted on an insulated substrate of the semiconductor circuit device according to the first embodiment are viewed from a front side of a semiconductor device 20.

First, a structure of semiconductor chips 10 mounted on an insulated substrate (first substrate) 80 (refer to later-described FIGS. 8 and 9) of a semiconductor circuit device 100 according to the first embodiment is described. The semiconductor chips 10 (10a, 10b, 10c) depicted in FIGS. 1 to 3 have mutually different layouts of electrode pads 21a, 21b, 22, 23a, 23b (one pad set) on respective front surfaces thereof. The semiconductor devices 20 are disposed on the semiconductor chips 10, respectively, and each has, in an active region 1 thereof, a main semiconductor device element (semiconductor device element) 11 and one or more circuit portions (semiconductor device element) for protecting and controlling the main semiconductor device element 11.

The main semiconductor device element 11 is a vertical MOSFET that performs a main operation of the semiconductor device 20 and is configured by multiple unit cells (functional units of a device element) connected in parallel to one another by a later-described source pad 21a. The main semiconductor device element 11 is disposed in an effective region (hereinafter, main effective region) 1a of the active region 1. The main effective region 1a is a region through which a main current of the main semiconductor device element 11 flows when the main semiconductor device element 11 is ON. The main effective region 1a, for example, has a substantially rectangular shape in a plan view and occupies a majority of the surface area of the active region 1.

Circuit portions for protecting and controlling the main semiconductor device element 11, for example, are high-function portions such as a current sensing portion 12, a temperature sensing portion 13, an over-voltage protecting portion (not depicted), and an arithmetic circuit portion (not depicted) disposed in a main non-operating region 1b of the active region 1. The main non-operating region 1b is a region free of unit cells of the main semiconductor device element 11 and does not function as the main semiconductor device element 11. The main non-operating region 1b, for example, has a substantially rectangular shape in a plan view and is disposed between the main effective region 1a and an edge termination region 2.

The edge termination region 2 is a region between the active region 1 and ends of the semiconductor chip 10, the edge termination region 2 surrounds a periphery of the active region 1 and sustains a breakdown voltage by mitigating electric field of the front side of the semiconductor chip 10. In the edge termination region 2, for example, a voltage withstanding structure (not depicted) such as a field limiting ring (FLR) or a junction termination extension (JTE) is disposed. The breakdown voltage is a voltage limit at which no erroneous operation or destruction of a device element occurs.

The source pad (electrode pad) 21a of the main semiconductor device element 11 is disposed on the front surface of the semiconductor chip 10, in the main effective region 1a. The main semiconductor device element 11 has a large current capability compared to other circuit portions. Therefore, the source pad 21a of the main semiconductor device element 11 has a shape in a plan view thereof substantially the same as that of the main effective region 1a and covers substantially an entire area of the main effective region 1a. The source pad 21a of the main semiconductor device element 11 is disposed separate from electrode pads other than the source pad 21a.

The electrode pads other than the source pad 21a are disposed separate from one another on the front surface of the semiconductor chip 10, in the main non-operating region 1b. The electrode pads other than the source pad 21a are, for example, a gate pad 21b of the main semiconductor device element 11, an electrode pad (OC pad (second source pad)) 22 of the current sensing portion 12, electrode pads (anode pad and cathode pad) 23a, 23b of the temperature sensing portion 13, an electrode pad (hereinafter, 0V pad, not depicted) of the over-voltage protecting portion, and an electrode pad (not depicted) of the arithmetic circuit portion.

The electrode pads other than the source pad 21a, for example, have a substantially rectangular shape in a plan view and have a surface area necessary for joining later-described terminal pins (metal members) 48b, 48c, 48d, 48e and a bonding wire (not depicted). A layout of the electrode pads other than the source pad 21a, as described hereinafter, is determined according to an overall layout of all the semiconductor chips 10 to be mounted on the insulated substrate 80 (refer to FIGS. 8 and 9). The electrode pads other than the source pad 21a, for example, may be disposed in a single row along one side of a substantially rectangular border between the main non-operating region 1b and the edge termination region 2 (FIGS. 1 and 2).

The electrode pads other than the source pad 21a may be disposed in an L-shape along 2 sides common to one vertex of the substantially rectangular border between the main non-operating region 1b and the edge termination region 2 (FIG. 3). Shapes of the main effective region 1a and the main non-operating region 1b in a plan view may be set according to the layout of the electrode pads other than the source pad 21a. In FIGS. 1 to 3, the source pad 21a, the gate pad 21b, the OC pad 22, the anode pad 23a, and the cathode pad 23b are depicted as rectangular shapes appended with "S", "G", "OC", "A", and "K", respectively (similarly in FIGS. 6 to 8).

The current sensing portion 12 operates under the same conditions as those of the main semiconductor device element 11 and has a function of detecting overcurrent (OC) flowing in the main semiconductor device element 11. The current sensing portion 12 is disposed separate from the main semiconductor device element 11. The current sensing portion 12 is a vertical MOSFET having unit cells each configured similarly to the unit cells of the main semiconductor device element 11; the current sensing portion 12 has a fewer number of unit cells (for example, about 10) than the number of unit cells of the main semiconductor device element 11 (for example, at least about one thousand) and a surface area smaller than that of the main semiconductor device element 11.

The unit cells of the current sensing portion 12 are disposed in a region (hereinafter, sensing effective region, hatched portion) 12a that is a portion of a region of the semiconductor chip 10 covered by the OC pad 22. The unit cells of the current sensing portion 12 are disposed adjacent to one another in a direction parallel to the front surface of the semiconductor chip 10. The direction along which the unit cells of the current sensing portion 12 are adjacent to one another, for example, is a same direction along which the unit cells of the main semiconductor device element 11 are adjacent to one another. The unit cells of the current sensing portion 12 are connected in parallel to one another by the OC pad 22.

Further, in the region of the semiconductor chip 10 covered by the OC pad 22, a region thereof excluding the sensing effective region 12a is a sensing non-operating region 12b that does not function as the current sensing portion 12. The sensing non-operating region 12b is free of the unit cells of the current sensing portion 12. In substantially an entire area of the main non-operating region 1b excluding the sensing effective region 12a, a later-described p-type base region 34b extends in a surface region of the semiconductor chip 10 at the front surface thereof, from the sensing effective region 12a (refer to FIG. 5).

The temperature sensing portion 13 has a function of detecting a temperature of the main semiconductor device element 11, using diode temperature characteristics. The temperature sensing portion 13 is disposed directly beneath the anode pad 23a and the cathode pad 23b. The temperature sensing portion 13, for example, may be a polysilicon diode configured by a polysilicon (poly-Si) layer provided on an interlayer insulating film 40 on the front surface of the semiconductor chip 10, or may be a diffusion diode formed by pn junctions between p-type regions and n-type regions formed in the semiconductor substrate 10.

The over-voltage protecting portion (not depicted), for example, is a diode that protects the main semiconductor device element 11 from overvoltage (0V) such as surges. The current sensing portion 12, the temperature sensing portion 13, and the over-voltage protecting portion are controlled by the arithmetic circuit portion. The main semiconductor device element 11 is controlled based on output signals of the current sensing portion 12, the temperature sensing portion 13, and the over-voltage protecting portion. The arithmetic circuit portion is configured by multiple semiconductor device elements such as complementary MOS (CMOS) circuits.

Figure 4:
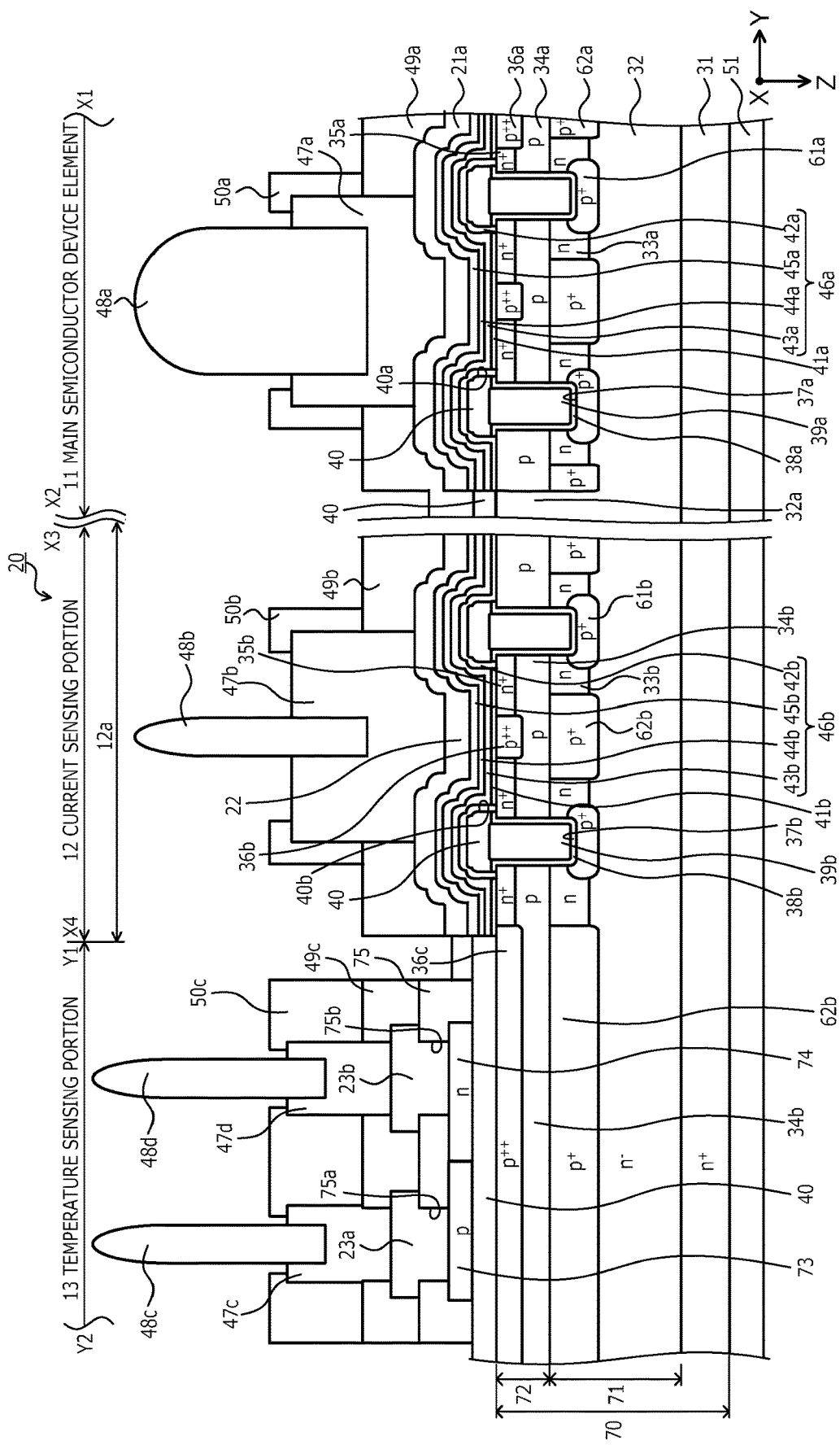
FIG. 4 is a cross-sectional view of a structure of an active region in FIG. 1.
Figure 5:
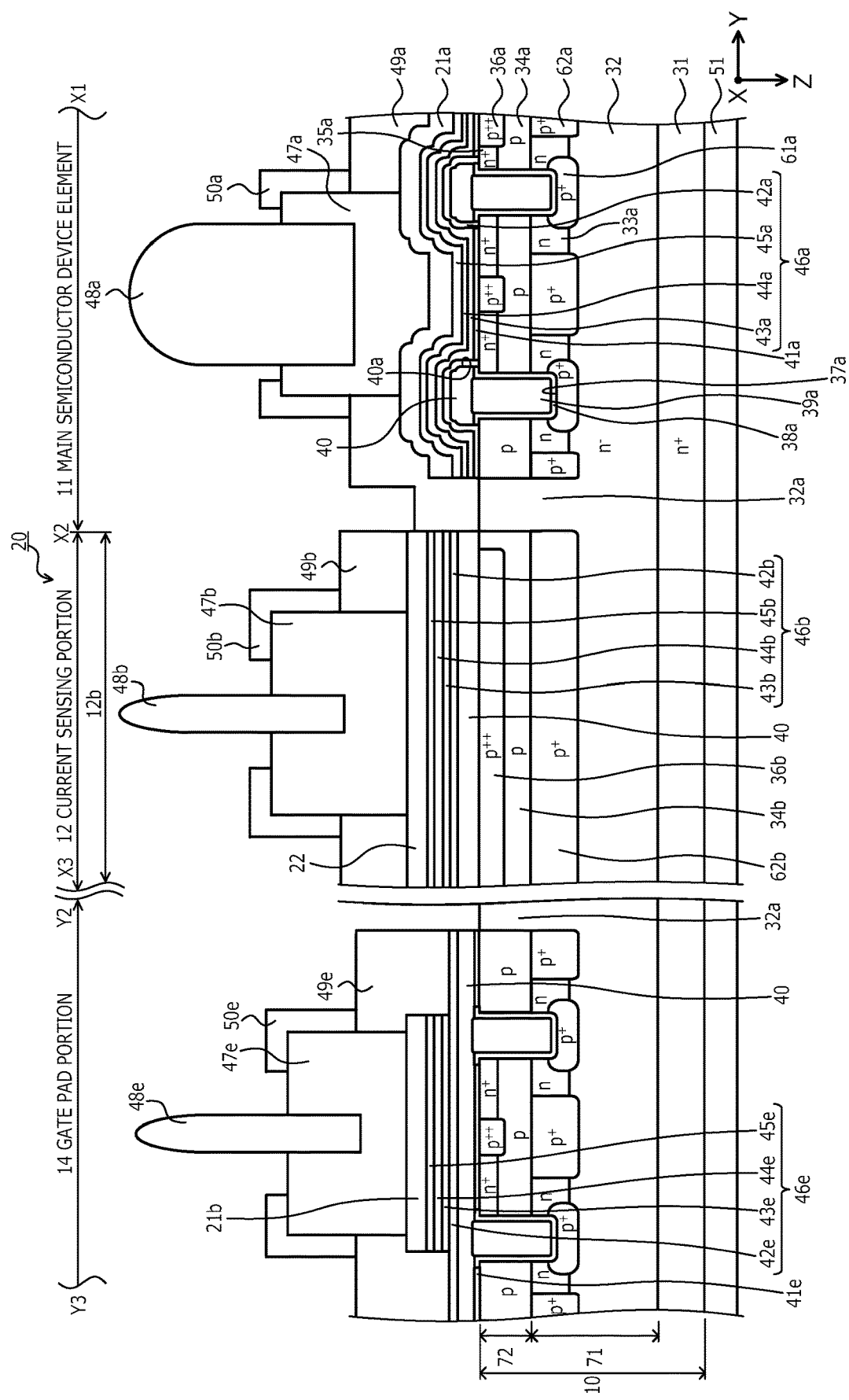
FIG. 5 is a cross-sectional view of the structure of the active region in FIG. 1.

Next, a cross-sectional view of the structure of the active regions 1 of the semiconductor devices 20 fabricated on the semiconductor chips 10 is described. FIGS. 4 and 5 are cross-sectional views of the structure of the active region in FIG. 1. FIG. 4 depicts a cross-sectional view of the structure of the main effective region 1a, the sensing effective region 12a, and the temperature sensing portion 13 (cross-sectional view of the structure along cutting line X1-X2, cutting line X3-X4, and cutting line Y1-Y2 in FIG. 1. FIG. 5 depicts a cross-sectional view of the structure of the main effective region 1a, the sensing non-operating region 12b, and a gate pad portion 14 (the structure along cutting line X1-X2-X3 and cutting line Y2-Y3 in FIG. 1).

While FIGS. 4 and 5 only depict a portion of the respective unit cells of the main effective region 1a and the sensing effective region 12a, the unit cells of the main effective region 1a and the sensing effective region 12a all have the same structure. Further, while FIGS. 4 and 5 depict the structure of the active region 1 in FIG. 1 and the respective layouts of the electrode pads on the front surfaces of the semiconductor chips 10 differ, the active regions 1 in FIGS. 1 to 3 all have the same structure. Therefore, the main effective region 1a, the sensing effective region 12a, the sensing non-operating region 12b, the temperature sensing portion 13, and the gate pad portion 14 in FIGS. 2 and 3 are similar to those depicted in FIGS. 4 and 5.

The main semiconductor device element 11 is a vertical MOSFET provided on the front side of the semiconductor chip 10 in the main effective region 1a and having MOS gates that are insulated gates having a 3-layer structure including a metal, an oxide film, and a semiconductor. Here, while an instance in which the main semiconductor device element 11 and the circuit portions that protect and control the main semiconductor device element 11 each has a wiring structure of a same configuration using pin-shaped wiring members (implant pins (conductive posts): later-described terminal pins 48a, 48b, 48c, 48d, 48e) is described as an example, the wiring structure may use wires (metal members) instead of the pin-shaped wiring members.

The semiconductor chip 10 is formed by epitaxially growing, sequentially, silicon carbide layers 71, 72 constituting an $n^-$-type drift region 32 and a p-type base region 34a on a front surface of a $n^+$-type starting substrate 31 containing silicon carbide. A first main surface of the semiconductor chip 10 having the silicon carbide layer 71 is assumed as a front surface while a second main surface of the semiconductor chip 10 having the $n^+$-type starting substrate 31 is assumed as a back surface. The main semiconductor device element 11 has, at a front side of the semiconductor chip 10, general MOS gates configured by the p-type base region 34a, n+-type source regions 35a, trenches 37a, gate insulating films 38a, and gate electrodes 39a.

The trenches 37a penetrate through the p-type silicon carbide layer 72 in a depth direction Z from the front surface of the semiconductor chip 10 (surface of the p-type silicon carbide layer 72) and reach the n−-type silicon carbide layer 71. The trenches 37a, for example, may be disposed in a striped pattern extending in a direction parallel to the front surface of the semiconductor chip 10 or may be disposed in a matrix-like pattern as viewed from the front surface of the semiconductor chip 10. In FIGS. 4 and 5, for example, the trenches 37a are depicted extending in a striped pattern in a first direction X along which the electrode pads 21b, 23a, 23b, 22 are arranged (refer to FIG. 1).

In the trenches 37a, the gate electrodes 39a are provided via the gate insulating films 38a, respectively. Between adjacent trenches of the trenches 37a, in surface regions of the semiconductor chip 10 at the front surface thereof, the p-type base region 34a, the n+-type source regions 35a, and p++-type contact regions 36a are selectively provided. The n+-type source regions 35a and the p++-type contact regions 36a are provided between the front surface of the semiconductor chip 10 and the p-type base region 34a, and are in contact with the p-type base region 34a.

The n+-type source regions 35a are in contact with the gate insulating films 38a at sidewalls of the trenches 37a. The p++-type contact regions 36a are provided farther from the trenches 37a than are the n+-type source regions 35a. The p++-type contact regions 36a may be omitted. In this instance, instead of the p++-type contact regions 36a, the p-type base region 34a reaches the front surface of the semiconductor chip 10 and is in contact with the n+-type source regions 35a in a second direction Y that is parallel to the front surface of the semiconductor chip 10 and orthogonal to the first direction X.

In the semiconductor chip 10, between the p-type base region 34a and an n+-type drain region (the n+-type starting substrate 31), the n−-type drift region 32 is provided in contact with the p-type base region 34a and the n+-type starting substrate 31. Between the p-type base region 34a and the n−-type drift region 32, n-type current spreading regions 33a may be provided in contact with these regions. The n-type current spreading regions 33a constitute a so-called current spreading layer (CSL) that reduces carrier spreading resistance.

Further, in the semiconductor chip 10, at positions closer to the n+-type drain region than is the p-type base region 34a, first and second p+-type regions 61a, 62a that mitigate electric field applied to bottoms of the trenches 37a may be provided. The first p+-type regions 61a are provided separate from the p-type base region 34a and face the bottoms of the trenches 37a in the depth direction Z, respectively. The second p+-type regions 62a are provided between adjacent trenches of the trenches 37a, separate from the first p+-type regions 61a and the trenches 37a, and in contact with the p-type base region 34a.

The interlayer insulating film 40 is provided in an entire area of the front surface of the semiconductor chip 10 and covers the gate electrodes 39a. All the gate electrodes 39a of the main semiconductor device element 11, at a non-depicted portion, are electrically connected to the gate pad 21b (refer to FIG. 1) via a gate runner (not depicted). The gate runner is provided on the front surface of the semiconductor chip 10 via the interlayer insulating film 40 in the edge termination region 2 (refer to FIGS. 1 to 3) and is formed by a gate polysilicon layer surrounding a periphery of the active region 1.

First contact holes 40a that penetrate through the interlayer insulating film 40 in the depth direction Z and reach the semiconductor chip 10 are provided. In the first contact holes 40a, the n+-type source regions 35a and the p++-type contact regions 36a of the main semiconductor device element 11 are exposed. In the first contact holes 40a, a nickel silicide (NiSi, Ni$_2$Si, or thermally stable NiSi$_2$, hereinafter, collectively, "NiSi") film 41a is provided only on the front surface of the semiconductor chip 10.

The NiSi film 41a is in ohmic contact with the semiconductor chip 10 in the first contact holes 40a, and is electrically connected to the n+-type source regions 35a and the p++-type contact regions 36a. In an instance in which the p++-type contact regions 36a are omitted, the p-type base region 34a is exposed in the first contact holes 40a and electrically connected to the NiSi film 41a instead of the p++-type contact regions 36a.

In an entire area of the surfaces of the interlayer insulating film 40 and the NiSi film 41a in the main effective region 1a, a barrier metal 46a is provided along the surfaces of the interlayer insulating film 40 and the NiSi film 41a. The barrier metal 46a has a function of preventing interaction between metal films of the barrier metal 46a and interaction between regions facing each other across the barrier metal 46a. The barrier metal 46a, for example, may have a layered structure in which a first titanium nitride (TiN) film 42a, a first titanium (Ti) film 43a, a second TiN film 44a, and a second Ti film 45a are sequentially stacked.

The first TiN film 42a covers the entire area of the surface of the interlayer insulating film 40. The first TiN film 42a is not provided on the front surface of the semiconductor chip 10 where the NiSi film 41a is formed. The first Ti film 43a is provided on the surfaces of the first TiN film 42a and the NiSi film 41a. The second TiN film 44a is provided on the surface of the first Ti film 43a. The second Ti film 45a is provided on the surface of the second TiN film 44a. The barrier metal, for example, is not provided in the temperature sensing portion 13.

The source pad 21a is provided in an entire area of the surface of the second Ti film 45a and is electrically connected to the n+-type source regions 35a and the p-type base region 34a via the barrier metal 46a and the NiSi film 41a. The source pad 21a, for example, may be an aluminum-silicon-copper (Al—Si—Cu) film, an aluminum-silicon (Al—Si) film, or an aluminum (Al) film having a thickness of about 5 μm. The source pad 21a, the barrier metal 46a, and the NiSi film 41a function as a source electrode of the main semiconductor device element 11.

A first end of each of the terminal pins 48a is bonded on the source pad 21a, via plating films 47a and a solder layer (not depicted). A second end of each of the terminal pins 48a is directly bonded to a source pad (not depicted) on a printed circuit board (second substrate) 90 disposed so as to face the front surface of the semiconductor chip 10, or is electrically connected thereto via a circuit pattern (not depicted). The second end of each of the terminal pins 48a is exposed outside a case (not depicted) in which the semiconductor chip 10 is mounted, the second ends being electrically connected to an external device (not depicted).

The terminal pins 48a are wiring members having a round, rod-like shape (cylinder shape) having a predetermined diameter. The terminal pins 48a are soldered to the plating films 47a in a substantially upright state with respect to the front surface of the semiconductor substrate 10. The terminal pins 48a are external connection terminals that lead out the potential of the source pad 21a and the terminal pins 48a are connected to an external ground potential (minimum electric potential). Portions of the surface of the source pad 21a other than portions having the plating films 47a are covered by first protective films 49a. Borders between the plating films 47a and the first protective films 49a are covered by second protective films 50a.

The first and the second protective films 49a, 50a, for example, are polyimide films. A drain electrode 51 is in ohmic contact with an entire area of the back surface (back surface of the n$^+$-type starting substrate 31) of the semiconductor chip 10. On the drain electrode 51, for example, a drain pad (electrode pad, not depicted) having a layered structure in which a Ti film, a nickel (Ni) film, and a gold (Au) film are sequentially stacked is provided. The drain pad is soldered on a copper plate 82 (refer to FIG. 9) of the insulated substrate 80 and at least partially contacts a base portion of a cooling fin (not depicted) via the copper plate 82.

In this manner, the terminal pins 48a are bonded to the source pad 21a on the front surface of the semiconductor chip 10 and the drain pad of the back surface of the semiconductor chip 10 is bonded to the copper plate 82 of the insulated substrate 80, whereby a double-sided cooling structure in which a cooling structure is provided on both sides of the semiconductor substrate 10 is formed. Heat generated by the semiconductor substrate 10 is radiated from a fin portion of the cooling fin via the metal base plate 82 and is radiated from the printed circuit board 90 to which the terminal pins 48a of the front surface of the semiconductor chip 10 are bonded.

The current sensing portion 12 includes the p-type base region 34b, n$^+$-type source regions 35b, p$^{++}$-type contact regions 36b, trenches 37b, gate insulating films 38b, gate electrodes 39b, and the interlayer insulating film 40 respectively having configurations similar to configurations of corresponding parts of the main semiconductor device element 11. Parts of the MOS gates of the current sensing portion 12 are provided in the sensing effective region 12a of the main non-operating region 1b. The p-type base region 34b is apart from the p-type base region 34a of the main semiconductor device element 11 with an n$^-$-type region 32a of the semiconductor chip 10 at the front surface thereof intervening therebetween.

The p-type base region 34b, for example, extends in substantially an entire area of the main non-operating region 1b, from the sensing effective region 12a. Similarly to the main semiconductor device element 11, the current sensing portion 12 may have n-type current spreading regions 33b and first and second p$^+$-type high-concentration regions 61b, 62b. The p$^{++}$-type contact regions 36b may be omitted. The gate electrodes 39b are electrically connected to the gate pad 21b (refer to FIGS. 1 to 3) via a gate runner (not depicted). The gate electrodes 39b are covered by the interlayer insulating film 40.

In the sensing effective region 12a, in the interlayer insulating film 40, second contact holes 40b penetrating therethrough in the depth direction Z and reaching the semiconductor chip 10 are provided, whereby the n$^+$-type source regions 35b and the p$^{++}$-type contact regions 36b are exposed. In the sensing effective region 12a, similarly to the main semiconductor device element 11, a NiSi film 41b and a barrier metal 46b are provided on the front surface of the semiconductor chip 10. Reference characters 42b, 43b, 44b, and 45b are, respectively, a first TiN film, a first Ti film, a second TiN film, and a second Ti film configuring the barrier metal 46b.

In the second contact holes 40b, the NiSi film 41b is in ohmic contact with the semiconductor chip 10 and electrically connected to the n$^+$-type source regions 35b and the p$^{++}$-type contact regions 36b. In an instance in which the p$^{++}$-type contact regions 36b are omitted, instead of the p$^{++}$-type contact regions 36b, the p-type base region 34b is exposed in the second contact holes 40b and electrically connected to the NiSi film 41b. The barrier metal 46b extends on a portion of the interlayer insulating film 40 in the sensing non-operating region 12b.

On an entire area of the surface of the barrier metal 46b, the OC pad 22 is provided separate from the source pad 21a. The OC pad 22 is electrically connected to the n$^+$-type source regions 35b and the p-type base region 34b via the barrier metal 46b and the NiSi film 41b. The OC pad 22, for example, is formed concurrently with the source pad 21a, using a same material as that of the source pad 21a. The OC pad 22, the barrier metal 46b, and the NiSi films 41b function as a source electrode of the current sensing portion 12.

The terminal pins 48b are bonded on the OC pad 22 by a wiring structure similar to the wiring structure on the source pad 21a. The terminal pins 48b are wiring members having a round, rod-like shape (cylinder shape) having a diameter smaller than the diameter of the terminal pins 48a. The terminal pins 48b, for example, are external connection terminals that lead electric potential of the OC pad 22 out of the device and connect the OC pad 22 to a ground potential, via external resistors 15 (refer to FIG. 10). Reference characters 47b, 49b, and 50b are respectively plating films, first protective films, and second protective films configuring the wiring structure on the OC pad 22.

The p-type base region 34a of the main effective region 1a and the p-type base region 34b of the sensing effective region 12a are separated from a p-type region (not depicted) for device element isolation, by a non-depicted n$^-$-type region in a surface region of the semiconductor substrate 10. The p-type region for device isolation is provided in the edge termination region 2, in a substantially rectangular shape surrounding a periphery of the active region and is a floating p-type region that forms a pn junction with the n$^-$-type drift region 32 and thereby, forms a parasitic diode electrically isolating the active region 1 and the edge termination region 2 from each other.

The temperature sensing portion 13, for example, is a polysilicon diode formed by a pn junction between a p-type polysilicon layer 73 constituting a p-type anode region and an n-type polysilicon layer 74 constituting an n-type cathode region (FIG. 4). The p-type polysilicon layer 73 and the n-type polysilicon layer 74 are provided on the interlayer insulating film 40, in the main non-operating region 1b. The temperature sensing portion 13 is electrically insulated from the semiconductor chip 10, the main semiconductor device element 11, and the current sensing portion 12 by the interlayer insulating film 40.

In third and fourth contact holes 75a, 75b of an interlayer insulating film 75 covering the anode pad 23a and the cathode pad 23b, the anode pad 23a and the cathode pad 23b are in contact with the p-type polysilicon layer 73 and the n-type polysilicon layer 74, respectively. The anode pad 23a and the cathode pad 23b, for example, are formed using the same material as that of the source pad 21a and are formed concurrently with the source pad 21a. The terminal pins 48c, 48d are bonded on the anode pad 23a and on the cathode pad 23*b*, respectively, by wiring structures similar to the wiring structure on the source pad 21*a*.

The terminal pins 48*c*, 48*d* are external connection terminals that lead out potential of the anode pad 23*a* and the cathode pad 23*b*, respectively. The terminal pins 48*c*, 48*d* are wiring members having a round, rod-like shape having a predetermined diameter corresponding to the current capability of the temperature sensing portion 13. Reference characters 47*c* and 47*d* are plating films respectively configuring the wiring structure on the anode pad 23*a* and the wiring structure on the cathode pad 23*b*. Reference characters 49*c* and 50*c* are respectively first and second protective films configuring the wiring structure on the temperature sensing portion 13.

In the main non-operating region 1*b*, other than the current sensing portion 12 and the temperature sensing portion 13, the gate pad portion 14 is provided. The gate pad portion 14 is a region in which the gate pad 21*b* of the main semiconductor device element 11 is provided (FIG. 5). The MOS gates of the main semiconductor device element 11 may extend in the gate pad portion 14, from the main effective region 1*a*. The MOS gates formed in the gate pad portion 14 are covered by the interlayer insulating film 40.

In the gate pad portion 14, on the front surface of the semiconductor chip 10, similarly to the main semiconductor device element 11, a NiSi film 41*e* and a barrier metal 46*e* are provided. The gate pad 21*b* is provided on a portion of the interlayer insulating film 40 in the main non-operating region 1*b*, separate from other electrode pads. The gate pad 21*b*, for example, is formed concurrently with the source pad 21*a*, using a same material as that of the source pad 21*a*. The terminal pins 48*e* are bonded on the gate pad 21*b* as well, for example, by a wiring structure similar to the wiring structure on the source pad 21*a*.

The terminal pins 48*e* are external connection terminals that lead out potential of the gate pad 21*b*. The terminal pins 48*e* are wiring members having a round, rod-like shape having a predetermined diameter corresponding to the gate voltage applied to the main semiconductor device element 11. Reference characters 42*e*, 43*e*, 44*e*, and 45*e* are, respectively, a first TiN film, a first Ti film, a second TiN film, and a second Ti film configuring a barrier metal 46*e*. Reference characters 47*e*, 49*e*, and 50*e* are, respectively, a plating film, first and second protective films configuring the wiring structure on the gate pad 21*b*.

Figure 6:
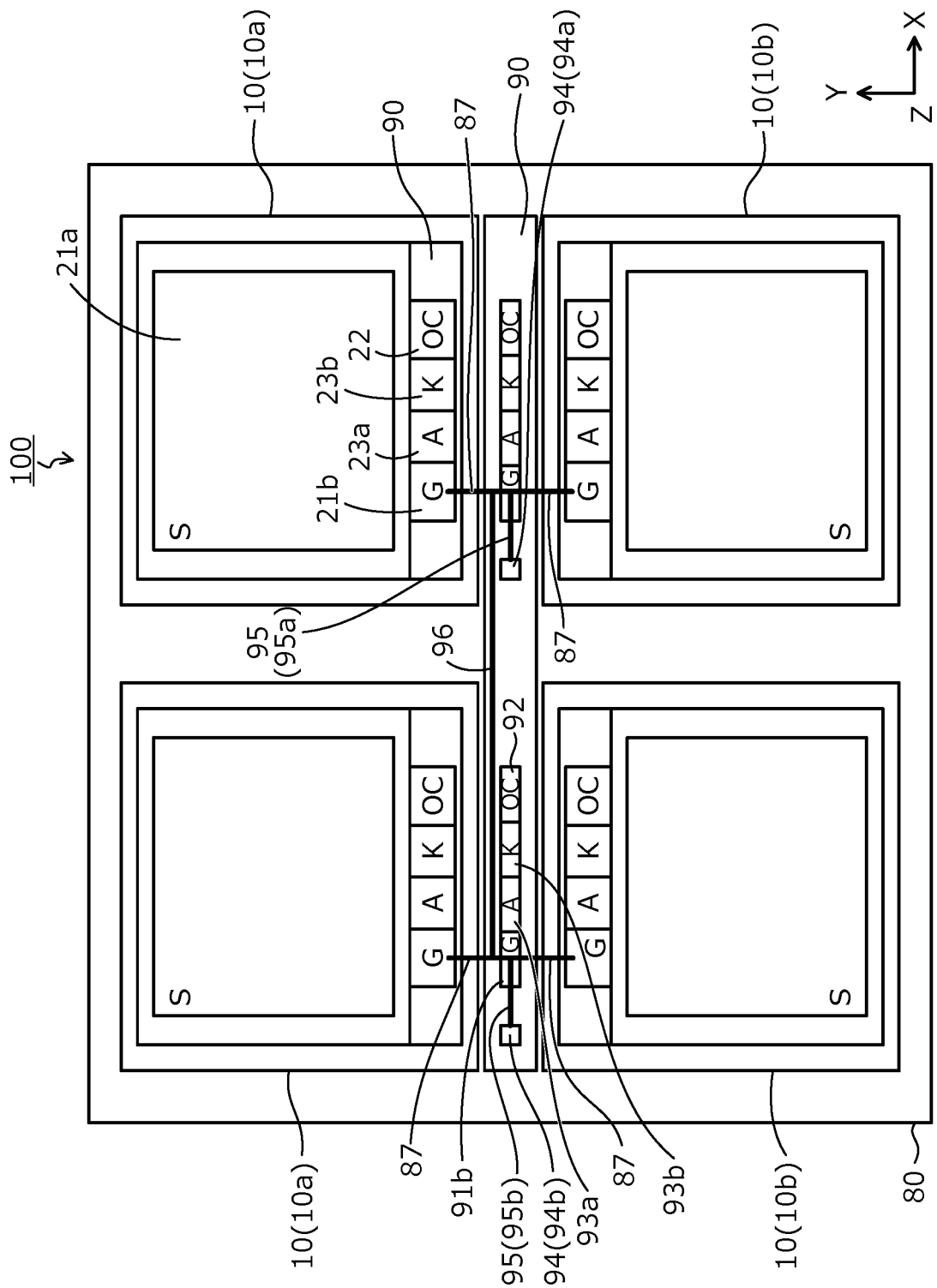
FIG. 6 is a plan view schematically depicting an example of a layout when the semiconductor circuit device according to the first embodiment is viewed from a front surface of the insulated substrate.
Figure 7:
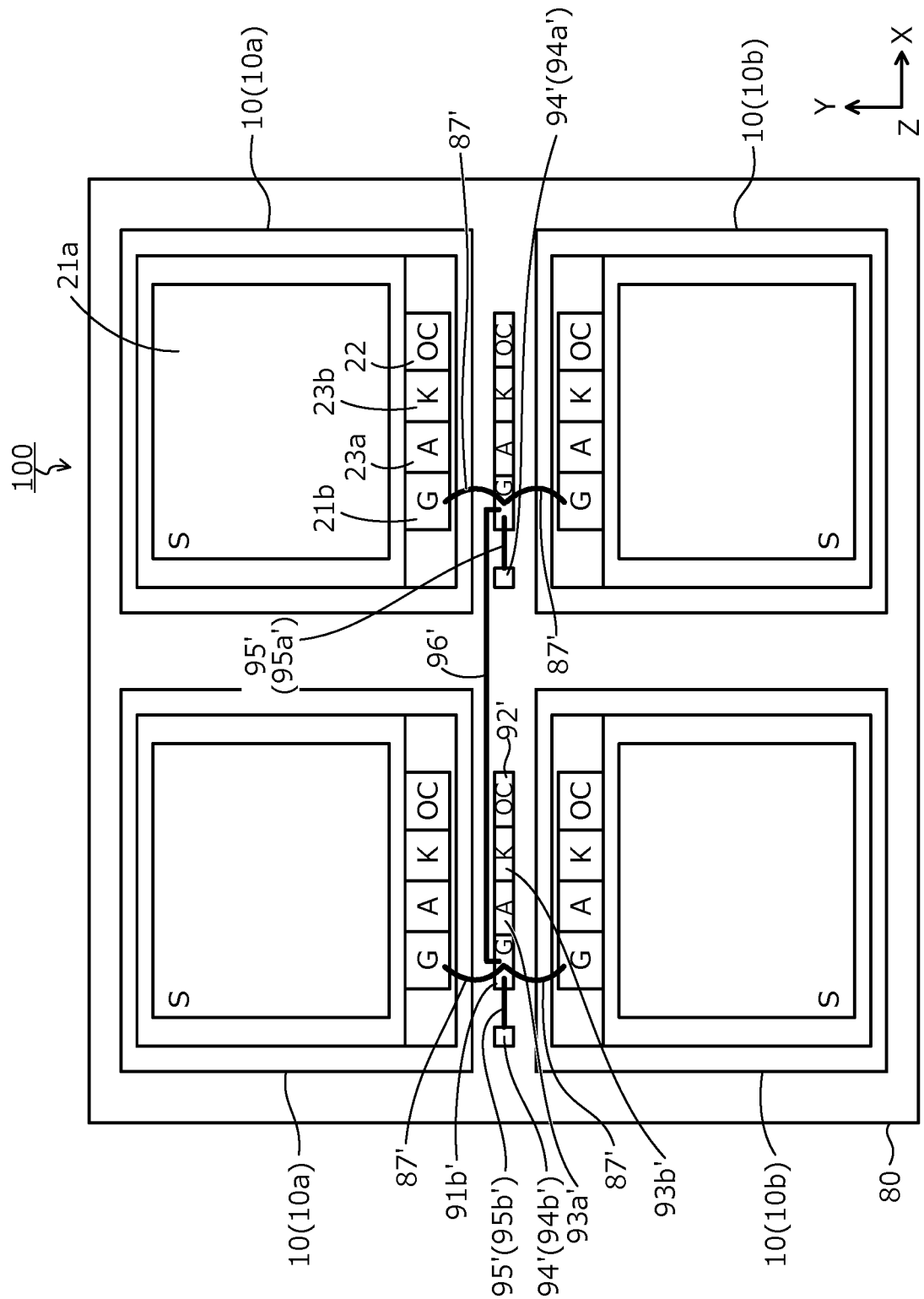
FIG. 7 is a plan view schematically depicting an example of a layout when the semiconductor circuit device according to the first embodiment is viewed from the front surface of the insulated substrate.
Figure 8:
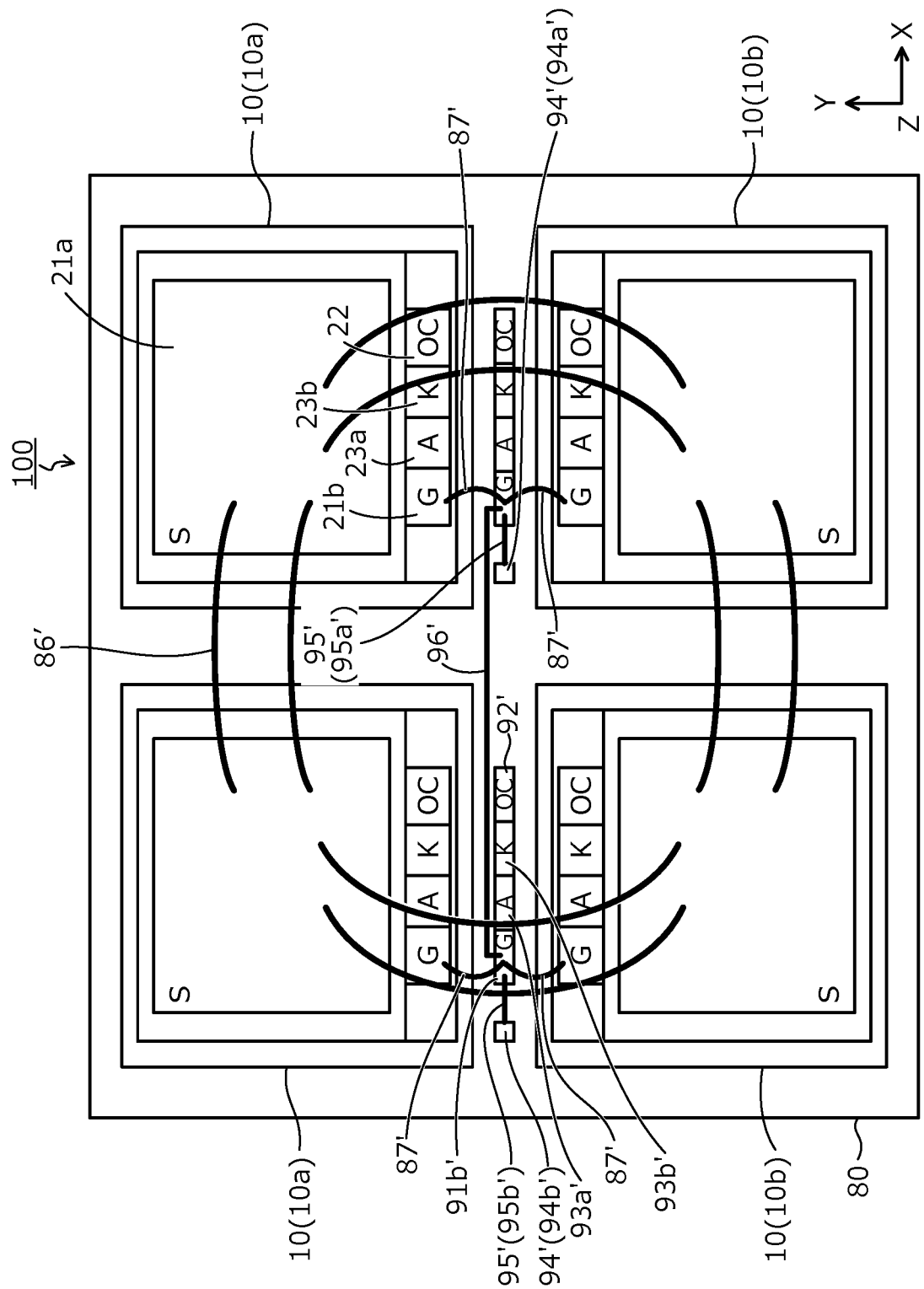
FIG. 8 is a plan view schematically depicting an example of a layout when the semiconductor circuit device according to the first embodiment is viewed from the front surface of the insulated substrate.
Figure 9:
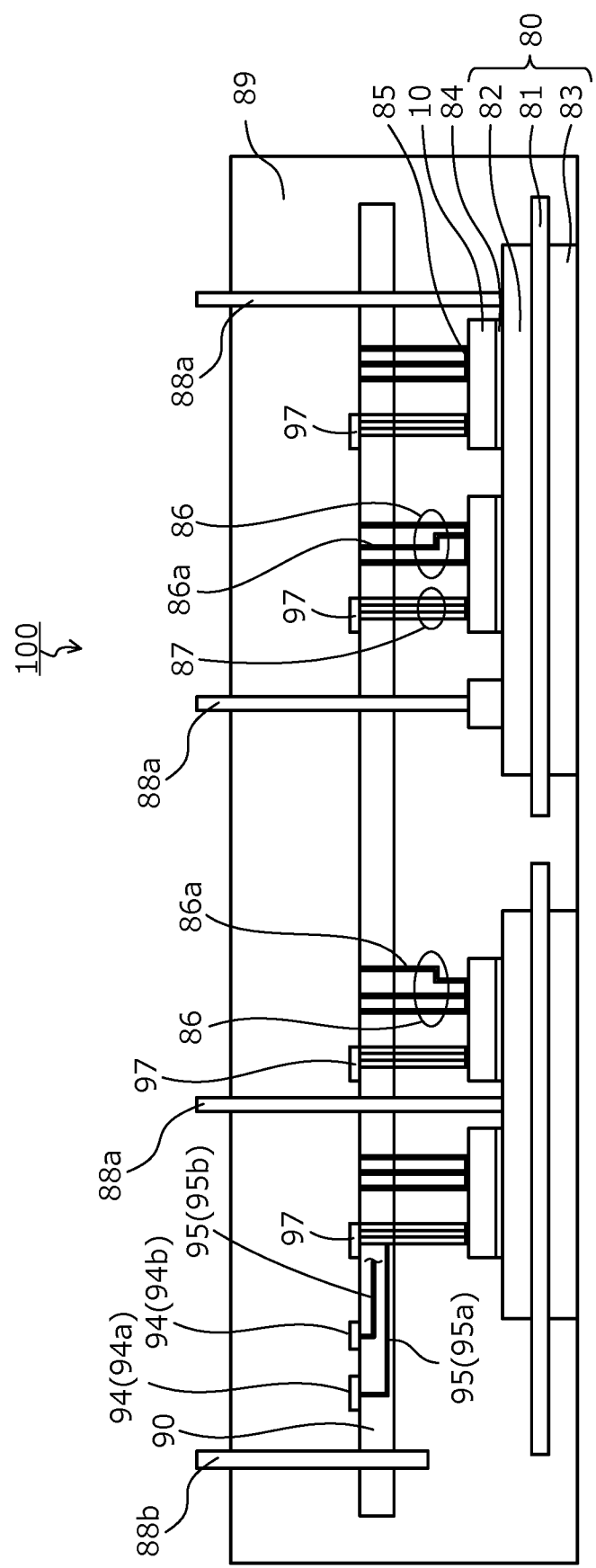
FIG. 9 is a cross-sectional view schematically depicting a structure of the semiconductor circuit device according to the first embodiment.

A structure of the semiconductor circuit device 100 according to the first embodiment is described. FIGS. 6, 7, and 8 are plan views schematically depicting an example of a layout when the semiconductor circuit device according to the first embodiment is viewed from the front surface of the insulated substrate. In FIG. 6, other than the insulated substrate 80, a portion of the printed circuit board 90 is depicted. FIG. 9 is a cross-sectional view schematically depicting the structure of the semiconductor circuit device according to the first embodiment. FIG. 9 is cross-sectional view of the structure of the semiconductor circuit device 100 in FIG. 6. In FIG. 9, to clarify the structure in a sealing material 89, the semiconductor chips 10 are depicted in an arrangement different from that in FIG. 6.

The semiconductor circuit device 100 according to the first embodiment depicted in FIGS. 6 and 9 includes the semiconductor chips 10, the insulated substrate 80, the printed circuit board 90, and external electrode terminals 88*a*, 88*b*. Each of the insulated substrates 80 includes an insulating plate 81, one of the copper (Cu) plates 82 bonded to one side of the insulating plate 81, and a heat dissipating plate 83 bonded to the other side of the insulating plate 81.

On each of the copper plates 82 of the insulated substrates 80, the semiconductor chips 10 (at least 2) (refer to FIGS. 1 to 3) are disposed. FIG. 6 depicts an instance in which a total of four (4) of the semiconductor chips 10 (10*a*, 10*b*) depicted in FIGS. 1 and 2 are disposed in a matrix-like pattern (similarly for FIGS. 7 and 8).

Electrode pads of a same type (hereinafter, same-type electrode pads) connected to the same parts of the corresponding semiconductor devices 20 formed on the semiconductor chips 10 mounted on the insulated substrates 80 are connected to one another via electrode pads of the printed circuit board 90, implant pins (metal members) 86, 87, and wiring (metal members) 96 (FIG. 6), or wires (bonding wire: metal members) 86', 87' (refer to FIGS. 7 and 8). For each of the semiconductor chips 10, circuit portions and semiconductor device elements fabricated thereon have the same configuration. There are at least two layout patterns for the electrode pads on the front surfaces of the respective semiconductor chips 10 and at least one of the semiconductor chips 10 has an electrode pad layout that is different from the electrode pad layout of the others (refer to FIGS. 1 to 3).

An overall layout of the semiconductor chips 10 mounted to the insulated substrate 80 and the layouts of the electrode pads on the front surfaces of the semiconductor chips 10 are determined so that resistance (R) components and reactance (L) components are less susceptible to being adversely affected by the wiring 96 and/or the wires 86', 87' connecting the same-type electrode pads of the semiconductor chips 10 to one another in parallel. For example, the overall layout of the semiconductor chips 10 mounted to the insulated substrate 80 and the layouts of the electrode pads on the front surfaces of the semiconductor chips 10 may be determined so that lengths of the wiring 96 and the wires 86', 87' are as short as possible.

Further, resistors 94*a*, 94*b* may be electrically connected to the electrode pads of the printed circuit board 90 so that resistance (R) components and/or reactance (L) components due to the wiring 96 and the wires 86', 87' become substantially uniform between the same-type electrode pads of the semiconductor chips 10 connected in parallel by the wiring 96 and the wires 86', 87'. The resistors 94*a*, 94*b* are connected in series between the electrode pads that are connected in parallel. A reactance component is inductive reactance or capacitive reactance. Substantially uniform means to be the same within a range that includes an allowable margin of error due to process variation. In particular, an instance may be considered to be substantially uniform when the difference of resistance (R) components or reactance (L) components is within 10%.

For example, layout of the semiconductor chips 10, connection locations of the resistors 94*a*, 94*b*, etc. are described taking, as an example, an instance in which the gate pads 21*b* of four (4) of the semiconductor chips 10 on the insulated substrate 80 are connected in parallel via the gate pads 91*b* and wiring (metal members) 95*a*, 95*b*, 96 on the printed circuit board 90 (FIG. 6). The four semiconductor chips 10 are disposed in a matrix-like pattern on the copper plate 82 of the insulated substrate 80. For example, two each of the semiconductor chips (hereinafter, first and second semiconductor chips 10*a*, 10*b*) depicted in FIGS. 1 and 2, respectively, are used as the four semiconductor chips 10.

The two first semiconductor chips 10*a* are disposed oriented similarly to and adjacent to each other in the first direction X. Therefore, the electrode pads thereof other than the source pad 21*a* (the gate pads 21*b*, the OC pads 22, the anode pads 23*a*, and the cathodes pad 23*b*) of the first semiconductor chips 10a are all disposed in a single row in the first direction X. The two second semiconductor chips 10b are disposed oriented similarly to and adjacent to each other in the first direction X. Therefore, the electrode pads thereof other than the source pad 21a of the second semiconductor chips 10b are all disposed in a single row in the first direction X.

As described above, each of the first and the second semiconductor chips 10a, 10b has a substantially rectangular shape in a plan view and in each of the first and the second semiconductor chips 10a, 10b, the electrode pads thereof other than the source pad 21a on the front surface thereof are disposed in a single row along a first side. The first semiconductor chips 10a are disposed adjacent to the second semiconductor chips 10b in the second direction Y so that the first sides thereof along which the electrode pads other than the source pad 21a are disposed face the first sides of the second semiconductor chips 10b. In the first semiconductor chips 10a, a sequence in which the electrode pads other than the source pad 21a are arranged in the first direction X is opposite to a sequence in which the electrode pads other than the source pad 21a are arranged in the second semiconductor chips 10b.

Therefore, by disposing the first and the second semiconductor chips 10a, 10b adjacent to one another in this manner in the second direction Y, the layout of the electrode pads on the front surfaces of the first semiconductor chips 10a and the layout of the electrode pads on the front surfaces of the second semiconductor chips 10b have line symmetry with respect to an axis passing between the first and the second semiconductor chips 10a, 10b in the first direction X. Other than the source pads 21, the electrode pads of the first semiconductor chips 10a and the electrode pads corresponding in type thereto of the second semiconductor chips 10b respectively face in the second direction Y.

The implant pins 86 that correspond to the terminal pins 48a in FIGS. 4 and 5 are bonded to the respective source pads 21a of the first and the second semiconductor chips 10a, 10b via corresponding solder layers 85. Different implant pins (conductive posts) 87 corresponding to the terminal pins 48e in FIG. 5, the terminal pins 48b in FIGS. 4 and 5, and the terminal pins 48c, 48d in FIG. 4 are bonded to the gate pads 21b, the OC pads 22, the anode pads 23a, and the cathode pads 23b of the first and the second semiconductor chips 10a, 10b, via the solder layers 85, respectively.

The printed circuit board 90 has a first surface and a second surface opposite to each other, the first surface faces the front surfaces of the first and the second semiconductor chips 10a, 10b and the second surface is assumed as a front surface of the printed circuit board 90; the implant pins 86, 87 are directly bonded or are electrically connected via a circuit pattern (not depicted), to a predetermined electrode pad of the front surface of the printed circuit board 90. The printed circuit board 90, for example, has electrode pads that respectively correspond to the electrode pads of the front surfaces of the first and the second semiconductor chips 10a, 10b, at positions to face the electrode pads of the front surfaces of the first and the second semiconductor chips 10a, 10b as much as possible.

For example, the source pads 21a of the first and the second semiconductor chips 10a, 10b, via the implant pins 86 respectively bonded thereto, are electrically connected to source pads (not depicted) of the printed circuit board 90. On the printed circuit board 90, the source pads may be disposed respectively facing the source pads 21a of the first and the second semiconductor chips 10a, 10b, or a common source pad may be disposed shared by the first semiconductor chips 10a adjacent to each other in the first direction X and a common source pad may be disposed shared by the second semiconductor chips 10b adjacent to each other in the first direction X.

The gate pads 21b, the OC pads 22, the anode pads 23a, and the cathode pads 23b of the first and the second semiconductor chips 10a, 10b are electrically connected to the gate pads 91b, OC pads 92, anode pads 93a, and cathode pads 93b of the printed circuit board 90, via the respectively different implant pins 87. The printed circuit board 90, for example, has one set (pad set) of pads including one of the gate pads 91b, one of the OC pads 92, one of the anode pads 93a, and one of the cathode pads 93b, for each pair of the first and the second semiconductor chips 10a, 10b that are adjacent to each other in the second direction Y.

The first and the second semiconductor chips 10a, 10b of each pair are adjacent to each other in the second direction Y and share one set of the pads including one of the gate pads 91b, one of the OC pads 92, one of the anode pads 93a, and one of the cathode pads 93b of the printed circuit board 90, disposed between and facing the first and the second semiconductor chips 10a, 10b of the pair. The gate pads 91b of the printed circuit board 90 are electrically connected to each other via the wiring 96 formed on the front surface of the printed circuit board 90. The OC pads 92 of the printed circuit board 90 may be electrically connected to each other, the anode pads 93a of the printed circuit board 90 may be electrically connected to each other, and the cathode pads 93b of the printed circuit board 90 may be electrically connected to each other, via non-depicted wiring similarly to the gate pads 91b.

Figure 21:
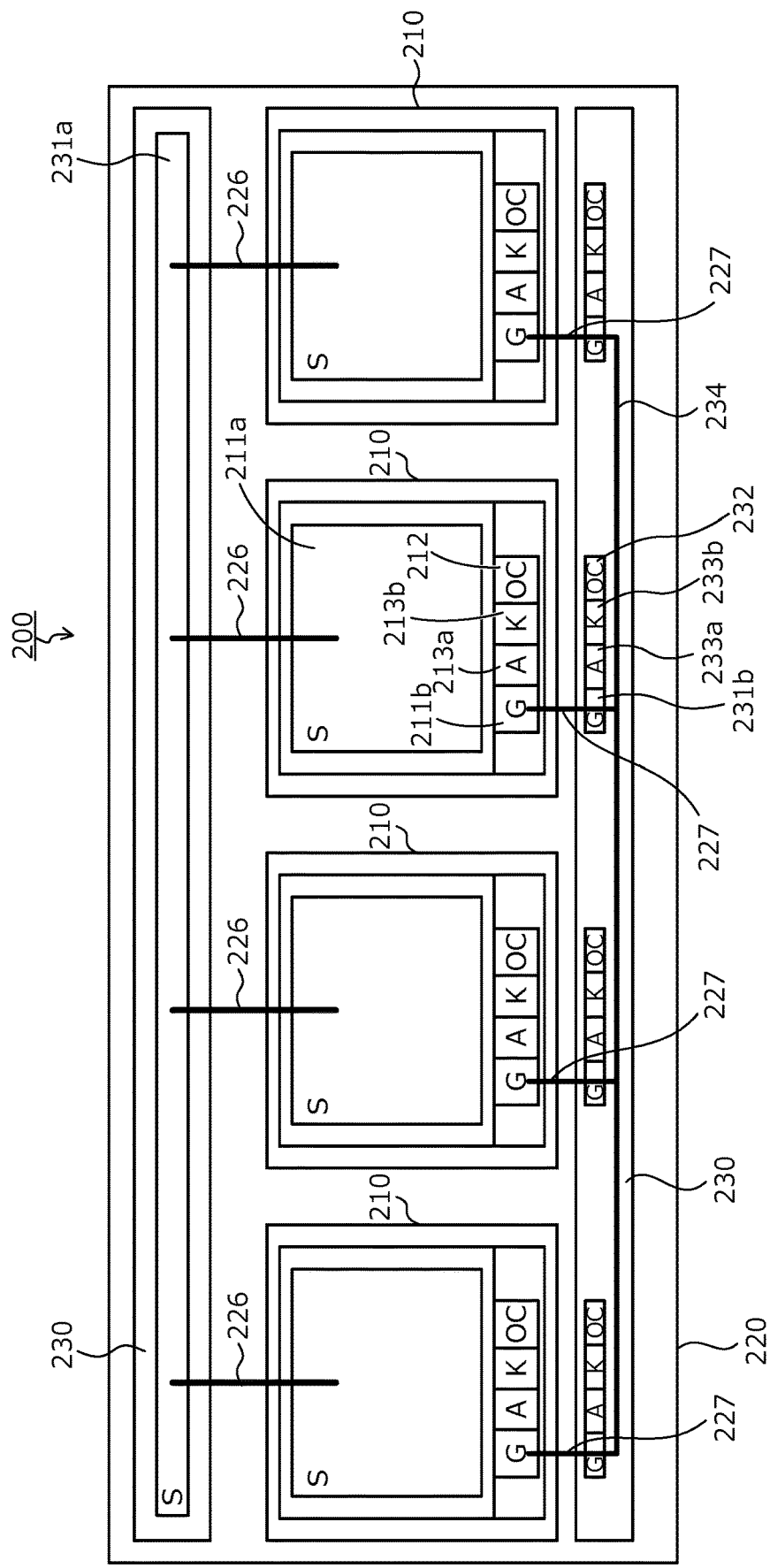
FIG. 21 is a plan view schematically depicting a layout when a conventional semiconductor circuit device is viewed from a front side of an insulated substrate.
Figure 22:
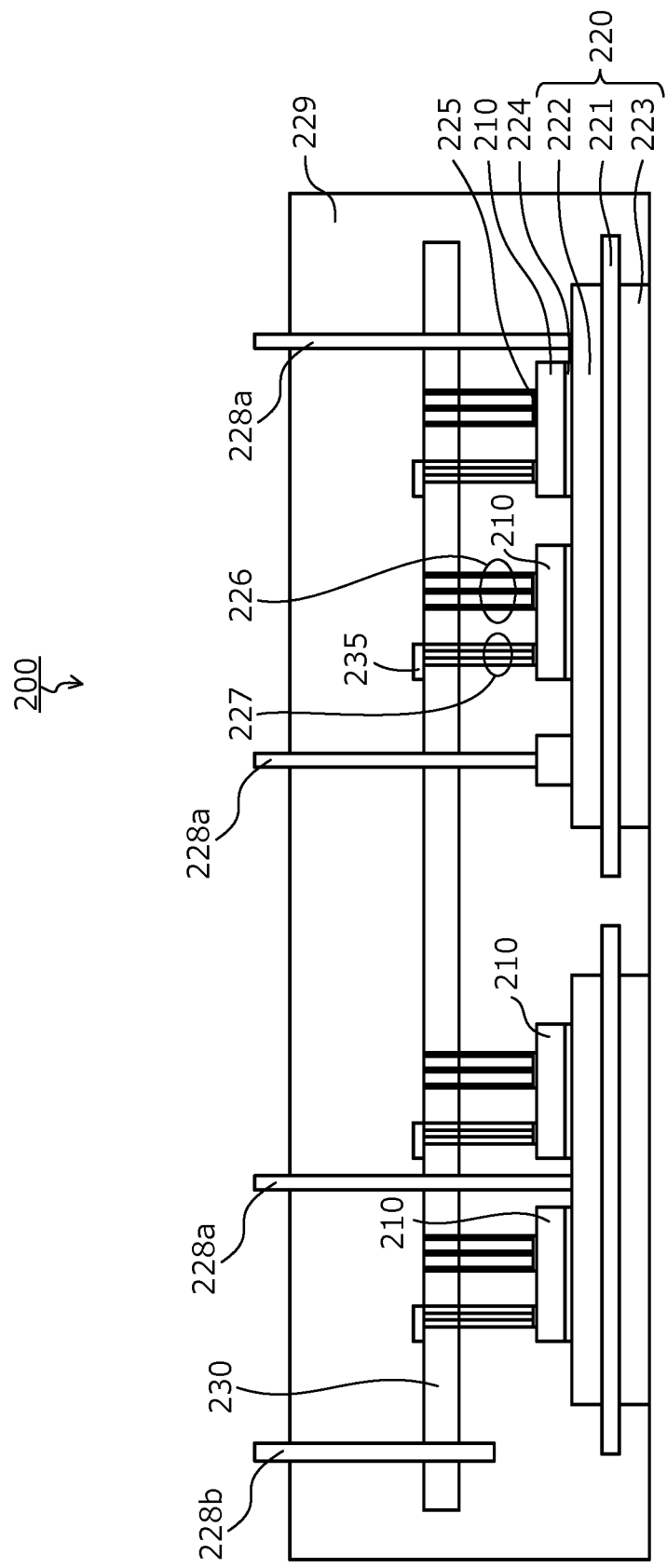
FIG. 22 is a cross-sectional view schematically depicting a structure of the conventional semiconductor circuit device.

A distance between the gate pads 21b of the first and the second semiconductor chips 10a, 10b that are adjacent to each in the second direction Y is shorter than a distance between the gate pads 211b of the semiconductor chips 210 of the conventional structure (refer to FIGS. 21 and 22). Therefore, a length of the wiring 96 connecting, in parallel, the gate pads 21b of all the semiconductor chips 10 (10a, 10b) on the insulated substrate 80 may be set to be shorter than a length of the wiring 234 of the conventional structure. Lengths of respective wirings (not depicted) connecting, in parallel, the OC pads 92 to each other, the anode pads 93a to each other, and the cathode pads 93b to each other of the printed circuit board 90 may also be set to be shorter than those in the conventional structure.

The resistors 94a, 94b may be electrically connected to the gate pads 91b of the printed circuit board 90, via the wiring 95a, 95b. The resistors 94a, 94b, for example, are a resistance component and a reactance component, respectively, disposed on the front surface of the printed circuit board 90. Resistance values and arrangement of the resistors 94a, 94b are set so that the resistance component and the reactance component between the gate pads 21b of the semiconductor chips 10 connected in parallel are substantially uniform. Different resistors 94a, 94b may be connected to the other electrode pads of the printed circuit board 90.

As described above, the source pads 21a on the front surfaces of all the semiconductor chips 10 on the insulated substrate 80 are electrically connected to the source pads of the printed circuit board 90 by the implant pins 86 and as described hereinafter, the drain pads of the back surfaces of the semiconductor chips 10 are bonded to the copper plate 82 of the insulated substrate 80, whereby the main semiconductor device elements 11 of the semiconductor devices fabricated on the semiconductor chips 10, respectively, are connected in parallel to one another. The gate pads 21b of all the semiconductor chips 10 on the insulated substrate 80 are connected in parallel to one another by the implant pins 87 and, the gate pads 91b and the wiring 96 of the printed circuit board 90.

First ends of the external electrode terminals 88a are bonded to the copper plate 82 of the front surface of the insulated substrate 80. The drain pads of the back surfaces of the first and the second semiconductor chips 10a, 10b are bonded to the copper plate 82 of the front surface of the insulated substrate 80 via a solder layer 84 and are electrically connected to the external electrode terminals 88a via the copper plate 82. A first end of the external electrode terminal 88b is bonded to a circuit pattern (not depicted) of the printed circuit board 90. Second ends of the external electrode terminals 88a, 88b protrude outside from the later-described sealing material 89. The external electrode terminals 88a, 88b lead out, to an external destination, potential of portions to which the external electrode terminals 88a, 88b are connected.

The insulated substrates 80, the semiconductor chips 10, the implant pins 86, 87, the printed circuit board 90, and the external electrode terminals 88a, 88b are sealed by the sealing material 89. The heat dissipating plate 83 of the insulated substrate 80 is bonded to a cooling device (not depicted), via a thermal conductive paste. During operation of the semiconductor circuit device 100, heat generated by the electrode pads and circuit patterns of the printed circuit board 90 and the semiconductor chips 10 is conducted from the insulated substrate 80 to the cooling device and dissipated, whereby the semiconductor chips 10 and the printed circuit board 90 are cooled. Reference numeral 97 represents control portions that control high-function portions of the semiconductor chips 10.

As depicted in FIG. 7, the gate pads 21b of all the semiconductor chips 10 (10a, 10b) on the insulated substrate 80 may be stitch-bonded and electrically connected to gate pads 91b' on the insulated substrate 80 by, for example, by wires 87' instead of the implant pins 87. The OC pads 22, the anode pads 23a, and the cathode pads 23b of the semiconductor chips 10, by respectively different wires, may be stitch-bonded and electrically connected to OC pads 92', anode pads 93a', and cathode pads 93b' on the insulated substrate 80.

In this case, the insulated substrate 80 has, for example, in between the first and the second semiconductor chips 10a, 10b that are adjacent to each other in the second direction Y, one set including one of the gate pads 91b', one of the OC pads 92', one of the anode pads 93a', and one of the cathode pads 93b' shared by the first and the second semiconductor chips 10a, 10b. The gate pads 91b' of the insulated substrate 80 are electrically connected to each other by the wiring 96'. Resistors 94a', 94b' may be electrically connected to the gate pads 91b' of the insulated substrate 80, via wiring 95a', 95b', and resistance components and/or reactance components between the gate pads 21b of the semiconductor chips 10 connected in parallel may be substantially uniform.

Further, as depicted in FIG. 8, in an instance in which 4 of the semiconductor chips 10 (10a, 10b) are disposed in a matrix-like pattern on the copper plate 82 of the insulated substrate 80, intervals between the semiconductor chips 10 adjacent to each other are equal. Therefore, instead of the implant pins 86, for example, the source pads 21a of the semiconductor chips 10 adjacent to each other in the first direction X may be electrically connected to each other by the wires 86' and the source pads 21a of the semiconductor chips 10 adjacent to each other in the second direction Y may be electrically connected to each other by the wires 86'. As a result, the resistance components and/or the reactance components between the source pads 21a of the semiconductor chips 10 connected in parallel may be set to be substantially uniform.

Further, as depicted in FIG. 9, an implant pin 86a (in FIG. 9, one (1)) of the implant pins 86 connected to the source pad 21a of a respective one of the semiconductor chips 10, for example, may be bent in an L-shape. The reactance component is added to the implant pin 86a by bending the implant pin 86a in this manner. As a result, even in an instance in which the intervals between the semiconductor chips 10 adjacent to each other are equal, adjustment is possible so that the reactance components between the source pads 21a of the semiconductor chips 10 connected in parallel becomes substantially uniform.

While not depicted, the implant pins 87 respectively bonded to the gate pad 21b, the OC pad 22, the anode pad 23a, and the cathode pad 23b of the semiconductor chip may be bent in an L-shape. In this instance, for example, instead of electrically connecting the resistors 94a', 94b' to the gate pads 91b, the OC pads 92, the anode pads 93a, and the cathode pads 93b of the printed circuit board 90, the resistance components and/or the reactance components between the electrode pads that are of the same type and connected to the semiconductor chips 10 that are connected in parallel may be adjusted to be substantially uniform by adjusting differences in the lengths of the implant pins 87 bent in an L-shape.

Figure 10:
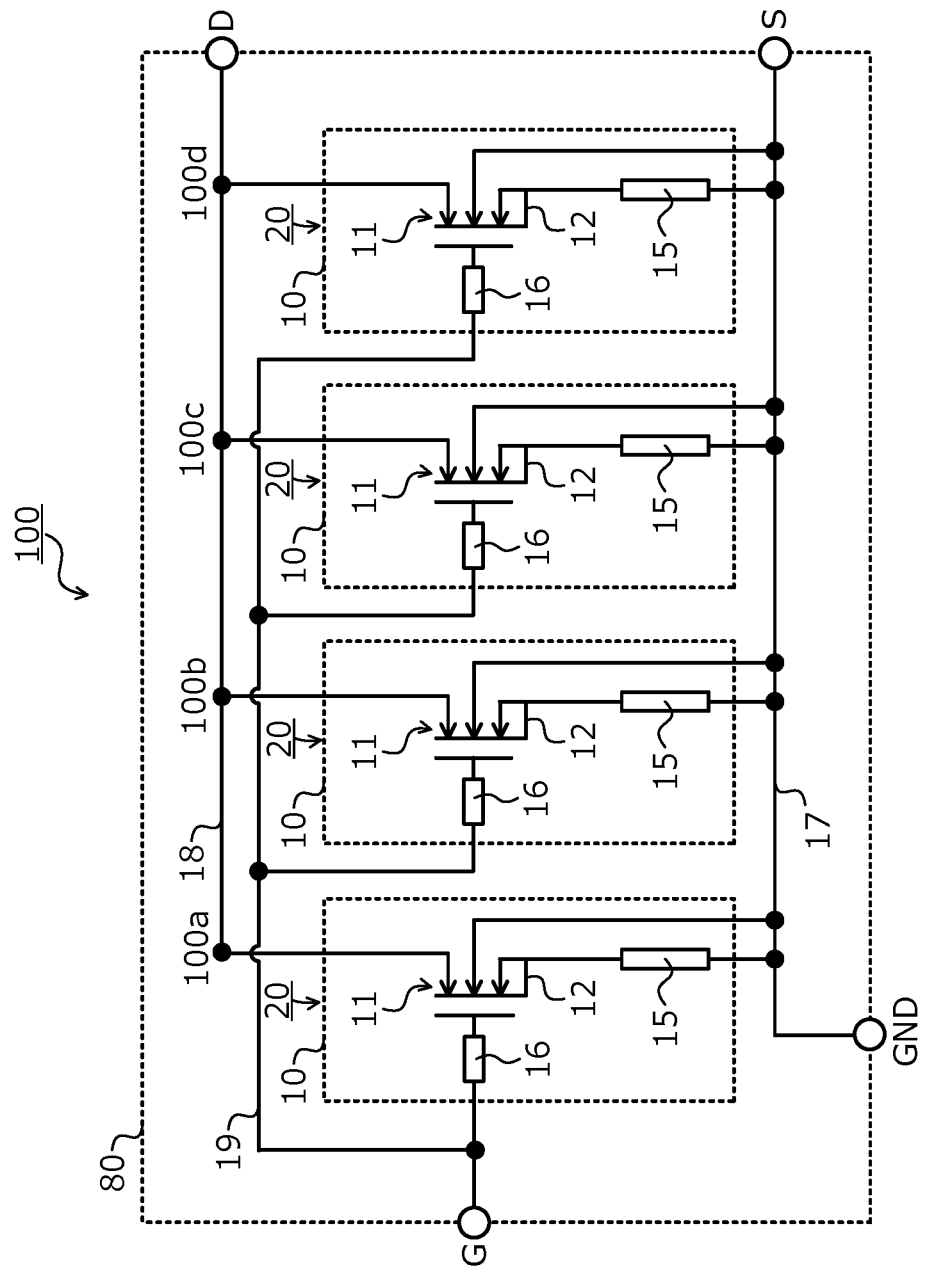
FIG. 10 is a circuit diagram depicting an equivalent circuit of the semiconductor circuit device according to the first embodiment.

Operation of the semiconductor circuit device 100 according to the first embodiment is described. FIG. 10 is a circuit diagram depicting an equivalent circuit of the semiconductor circuit device according to the first embodiment. As depicted in FIG. 10, the semiconductor devices 20 each including the main semiconductor device element 11 and the current sensing portion 12 connected in parallel to the main semiconductor device element 11 are fabricated, respectively, on the semiconductor chips 10 on the insulated substrate 80. Sources (the source pads 21a) of the main semiconductor device elements 11 on the semiconductor chips 10 are electrically connected to a source terminal S of a ground potential of a ground point GND, via source wiring 17.

Resistors 15 that are external components are connected between the ground point GND and sources of the current sensing portions 12. Drains (drain pads) of the main semiconductor device elements 11 are connected to a drain terminal D, via drain wiring 18. Gates of the main semiconductor device elements 11 are connected to a gate terminal G, via gate resistors 16 and gate wiring 19. In this manner, the main semiconductor device elements 11 of all the semiconductor chips 10 configuring the semiconductor circuit device 100 are connected between the drain wiring 18 and the source wiring 17, and the main semiconductor device elements 11 are connected in parallel.

When voltage that is positive with respect to the sources of the main semiconductor device elements 11 (refer to FIGS. 4 and 5) is applied to the drains (the drain electrodes 51) and voltage at least equal to the gate threshold voltage Vth is applied to the gates (the gate electrodes 39a) of the main semiconductor device elements 11, in each of the main semiconductor device elements 11, in portions of the p-type base region 34a between one of the n$^+$-type source regions 35a and one of the n-type current spreading regions 33a, an n-type inversion layer (channel) is formed. As a result, in each of the main semiconductor device elements 11, the main current flows in a direction from the drain to the source thereof, whereby the main semiconductor device element 11 turns ON.

As this time, under the same conditions as those for the main semiconductor device element 11, when voltage that is positive with respect to the source (the OC pad 22) of the current sensing portion 12 is applied to the drain (the drain electrode 51) and voltage that is at least equal to the gate threshold voltage is applied to the gate electrodes 39b of the current sensing portion 12, in the sensing effective region 12a, in portions of the p-type base region 34b between one of the n⁺-type source regions 35b and one of the n-type current spreading regions 33b, an n-type inversion layer is formed. As a result, a sensing current flows in a direction from the drain to the source of the current sensing portion 12, whereby the current sensing portion 12 turns ON.

The sensing current passes through the resistor 15 connected to the source of the current sensing portion 12 and flows to the ground point GND. As a result, a voltage drop occurs due to the resistor 15. In an instance in which overcurrent flows in the main semiconductor device element 11, the sensing current flowing in the current sensing portion 12 increases according to the magnitude of the overcurrent flowing in the main semiconductor device element 11, whereby the voltage drop at the resistor 15 occurring due to the flow of the sensing current to the resistors 15 increases. The magnitude of the voltage drop at the resistor 15 is monitored, whereby the overcurrent flowing in the main semiconductor device element 11 is detected.

On the other hand, when a voltage less than the gate threshold voltage Vth is applied to the gate electrodes 39a of the main semiconductor device element 11, pn junctions between the n⁻-type drift region 32 and the first and the second p⁺-type regions 61a, 62a and the n-type current spreading regions 33a of the main semiconductor device element 11 are reverse biased. The voltage that is less than the gate threshold voltage is further applied to the gate electrodes 39b of the current sensing portion 12, whereby pn junctions between the n⁻-type drift region 32 and the first and the second p⁺-type high-concentration regions 61b, 62b and the n-type current spreading regions 33b of the current sensing portion 12 are reverse biased. As a result, the main semiconductor device element 11 and the current sensing portion 12 maintain the OFF state.

The gate wiring 19 depicted in FIG. 10 corresponds to the wiring 96, 96' depicted in FIGS. 6 to 8. As described above, in the first embodiment, the length of the gate wiring 19 (the wiring 96, 96') is shorter than the length of the wiring 234 of the conventional structure (refer to FIG. 21). Additionally, the resistance components and/or the reactance components between the gate pads 21b of the semiconductor chips 10 that are connected in parallel are substantially uniform. As a result, when the semiconductor circuit device 100 turns OFF, variation of the gate threshold voltage Vth for each of the main semiconductor device elements 11 fabricated on the semiconductor chips 10 may be suppressed, whereby a voltage waveform 133 of the gate voltage Vg of the semiconductor circuit device 100 is resistant to oscillation.

Accordingly, a rising edge of the voltage waveform of the drain-source voltage Vds when the main semiconductor device elements 11 of the semiconductor chips 10 of the semiconductor circuit device 100 turn OFF may be set to be substantially the same and drain potentials at connection points 100a, 100b, 100c, 100d between the drain wiring 18 and the main semiconductor device elements 11 of the semiconductor chips 10 may be set to be substantially the same. As a result, a voltage waveform 132 of the drain-source voltage Vds of the semiconductor circuit device 100 may be set to be resistant to oscillation. Therefore, oscillation of a current waveform 131 of the drain-source current Ids when the semiconductor circuit device 100 turns OFF may be suppressed (refer to later-described FIG. 19).

Next, a method of manufacturing the semiconductor devices 20 fabricated on the semiconductor chips 10 mounted on the insulated substrate 80 (refer to FIGS. 6 to 9) of the semiconductor circuit device 100 according to the first embodiment is described. FIGS. 11, 12, 13, 14, 15, and 16 are cross-sectional views depicting manufacturing states of the semiconductor chips mounted on the insulated substrate of the semiconductor circuit device according to the first embodiment. In FIGS. 11 to 16, while only a portion of the main semiconductor device elements 11 are depicted, similar parts of all the device elements fabricated on one of the semiconductor chips 10, for example, are formed concurrently.

Figure 11:
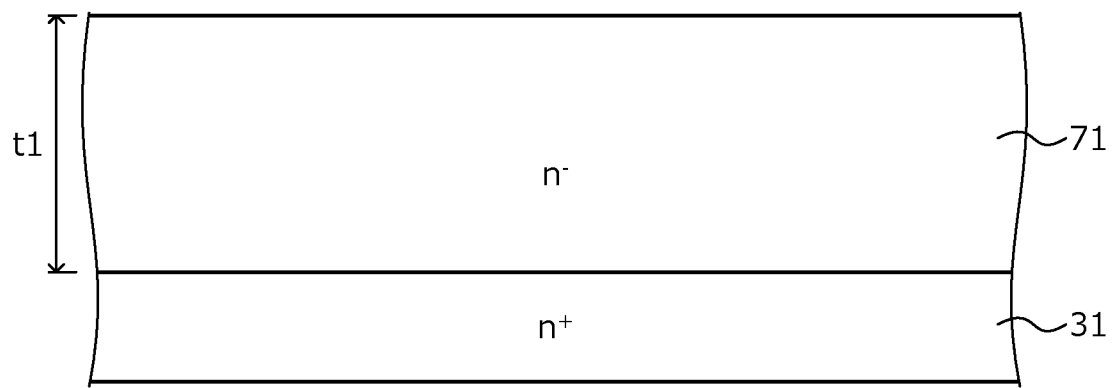
FIG. 11 is a cross-sectional view depicting a manufacturing state of the semiconductor chips mounted on the insulated substrate of the semiconductor circuit device according to the first embodiment.

First, as depicted in FIG. 11, the n⁺-type starting substrate (semiconductor wafer) 31 containing silicon carbide is prepared. The n⁺-type starting substrate 31, for example, may be a silicon carbide single crystal substrate doped with nitrogen (N). Next, the n⁻-type silicon carbide layer 71 doped with a lower concentration of nitrogen than is the n⁺-type starting substrate 31 is epitaxially grown on the front surface of the n⁺-type starting substrate 31. In an instance in which the main semiconductor device element 11 has a breakdown voltage of 3300V, a thickness t1 of the n⁻-type silicon carbide layer 71, for example, may be about 30 μm.

Figure 12:
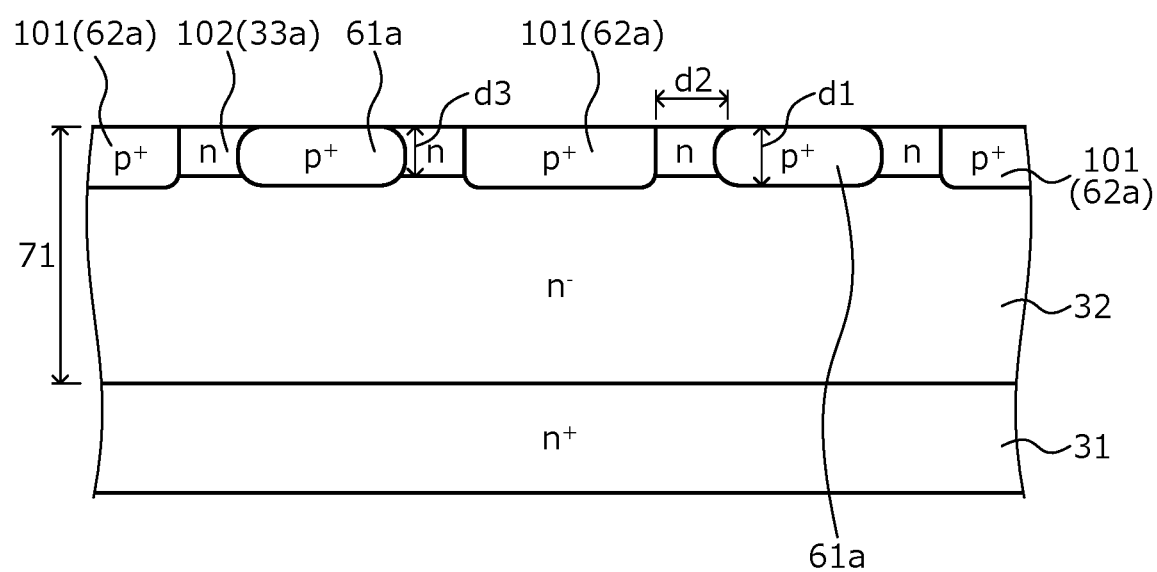
FIG. 12 is a cross-sectional view depicting a manufacturing state of the semiconductor chips mounted on the insulated substrate of the semiconductor circuit device according to the first embodiment.

Next, as depicted in FIG. 12, by photolithography and, for example, ion implantation of a p-type impurity such as Al, in the main effective region 1a, the first p⁺-type regions 61a and p⁺-type regions 101 are selectively formed in surface regions of the n⁻-type silicon carbide layer 71. The first p⁺-type regions 61a and the p⁺-type regions 101, for example, are disposed alternating one another in the first direction X (direction of view in FIG. 4) and extending in a striped pattern in the second direction Y (horizontal direction, refer to FIG. 4).

Next, by photolithography and, for example, ion implantation of an n-type impurity such as nitrogen, in an entire area of the main effective region 1a, n-type regions 102 are formed in surface regions of the n⁻-type silicon carbide layer 71. The n-type regions 102 are formed between the first p⁺-type regions 61a and the p⁺-type regions 101, so as to be in contact with the p⁺-type regions 61a, 101. A sequence in which the n-type regions 102, and the p⁺-type regions 61a, 101 are formed may be interchanged.

A distance d2 between one each of the p⁺-type regions 61a, 101 adjacent to each other, for example, is about 1.5 μm. The p⁺-type regions 61a, 101, for example, each as a depth d1 and an impurity concentration of about 0.5 μm and about $5.0 \times 10^{18}/cm^3$, respectively. The n-type regions 102 each has a depth d3 and an impurity concentration of, for example, about 0.4 μm and about $1.0 \times 10^{17}/cm^3$, respectively. A portion of the n⁻-type silicon carbide layer 71 free of ion implantation is the n⁻-type drift region 32.

Figure 13:
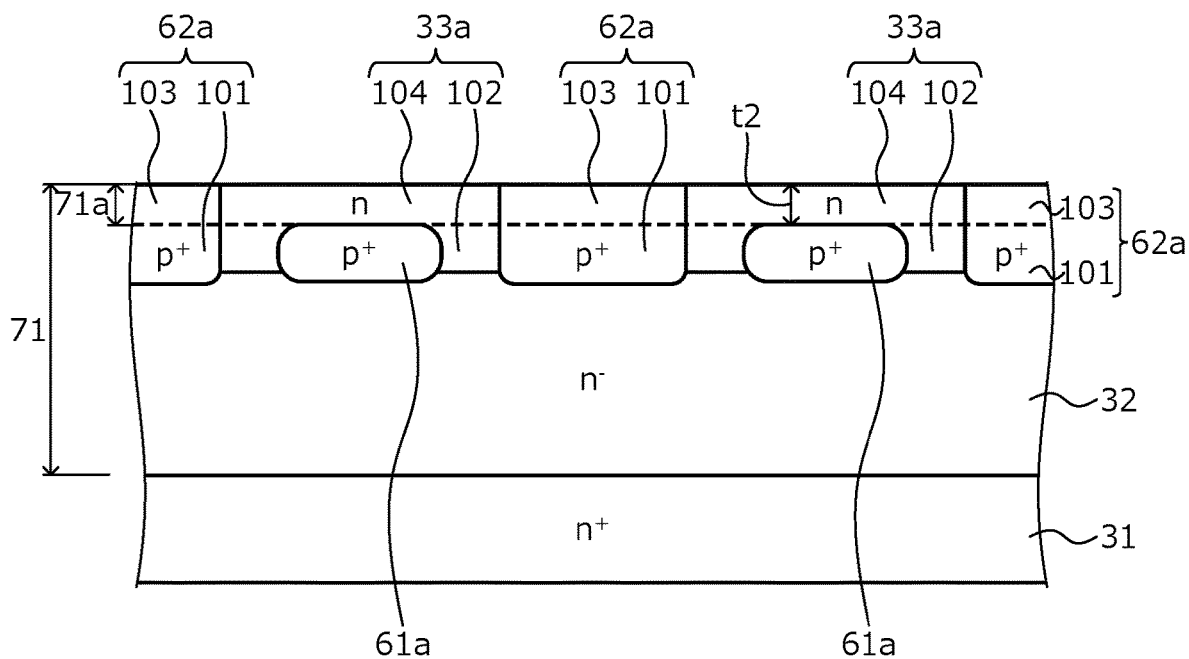
FIG. 13 is a cross-sectional view depicting a manufacturing state of the semiconductor chips mounted on the insulated substrate of the semiconductor circuit device according to the first embodiment.

Next, as depicted in FIG. 13, on the n⁻-type silicon carbide layer 71, for example, an n⁻-type silicon carbide layer doped with an n-type impurity such as nitrogen, for example, is further epitaxially grown to have a thickness t2 of about 0.5 μm, whereby the thickness of the n⁻-type silicon carbide layer 71 is increased. Next, by photolithography and ion implantation of a p-type impurity such as Al, p⁺-type regions 103 reaching the p⁺-type regions 101 are selectively formed in a portion 71a by which the thickness of the n⁻-type silicon carbide layer 71 is increased.

Next, by photolithography and, for example, ion implantation of an n-type impurity such as nitrogen, n-type regions 104 reaching the n-type regions 102 are selectively formed in the portion 71a by which the thickness of the n⁻-type silicon carbide layer 71 is increased. The p⁺-type regions 101, 103 are respectively connected to one another, thereby forming the second p⁺-type regions 62a; and the n-type regions 102, 104 are connected to one another, thereby forming the n-type current spreading regions 33a. A sequence in which the p⁺-type regions 103 and the n-type regions 104 are formed may be interchanged.

Figure 14:
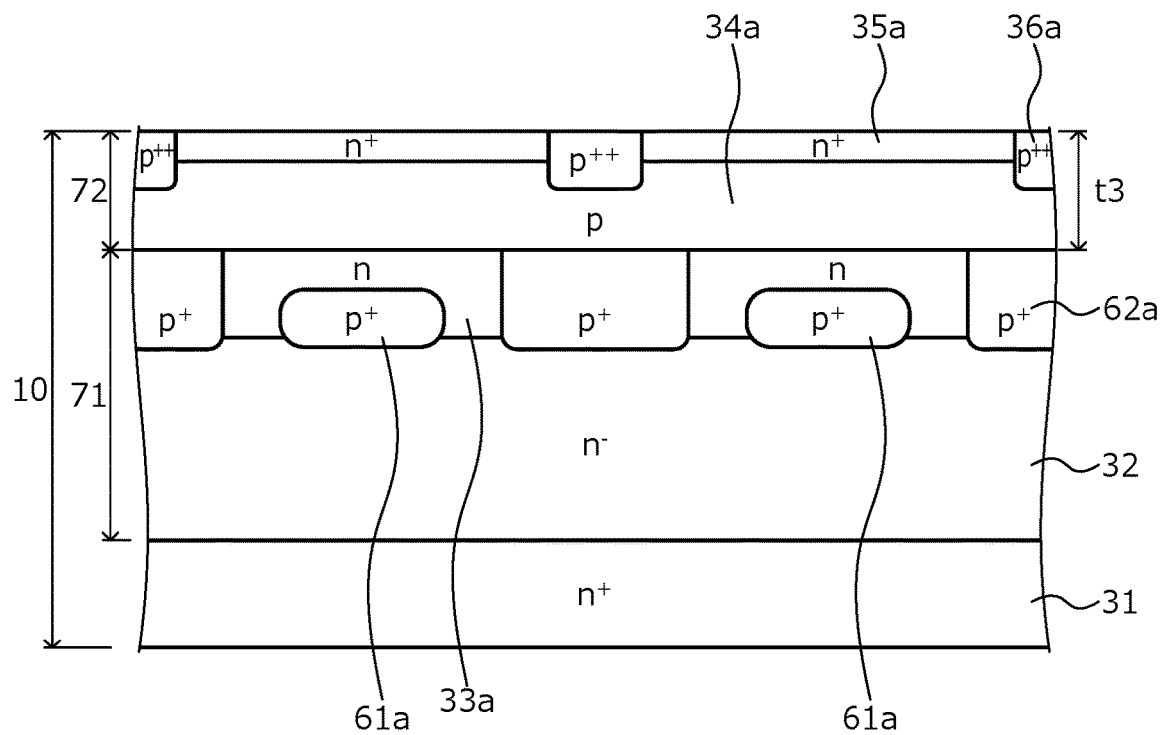
FIG. 14 is a cross-sectional view depicting a manufacturing state of the semiconductor chips mounted on the insulated substrate of the semiconductor circuit device according to the first embodiment.

Next, as depicted in FIG. 14, for example, the p-type silicon carbide layer 72 doped with a p-type impurity such as Al is epitaxially grown on the n⁻-type silicon carbide layer 71. The p-type silicon carbide layer 72 has a thickness t3 and an impurity concentration of, for example, about 1.3 µm and about $4.0 \times 10^{17}/cm^3$, respectively. By the processes up to here, the semiconductor wafer in which the n⁻-type silicon carbide layer 71 and the p-type silicon carbide layer 72 are sequentially stacked on the n⁺-type starting substrate 31 is fabricated.

Next, a process including photolithography and ion implantation as one set is repeatedly performed under different conditions, whereby in the main effective region 1a, the n⁺-type source regions 35a and the p⁺⁺-type contact regions 36a are selectively formed in surface regions of the p-type silicon carbide layer 72. Portions of the p-type silicon carbide layer 72 between the n⁻-type silicon carbide layer 71 and the n⁺-type source regions 35a and the p⁺⁺-type contact regions 36a constitute the p-type base region 34a.

Next, a heat treatment (activation annealing) for impurity activation is performed at a temperature of, for example, 1700 degrees C. for about 2 minutes for diffused regions (the first and the second p⁺-type regions 61a, 62a, the n-type current spreading regions 33a, the n⁺-type source regions 35a, and the p⁺⁺-type contact regions 36a) formed by ion implantation. The activation annealing may be performed one time collectively for all of the diffused regions after formation or may be performed each time diffused regions are formed by ion implantation.

Figure 15:
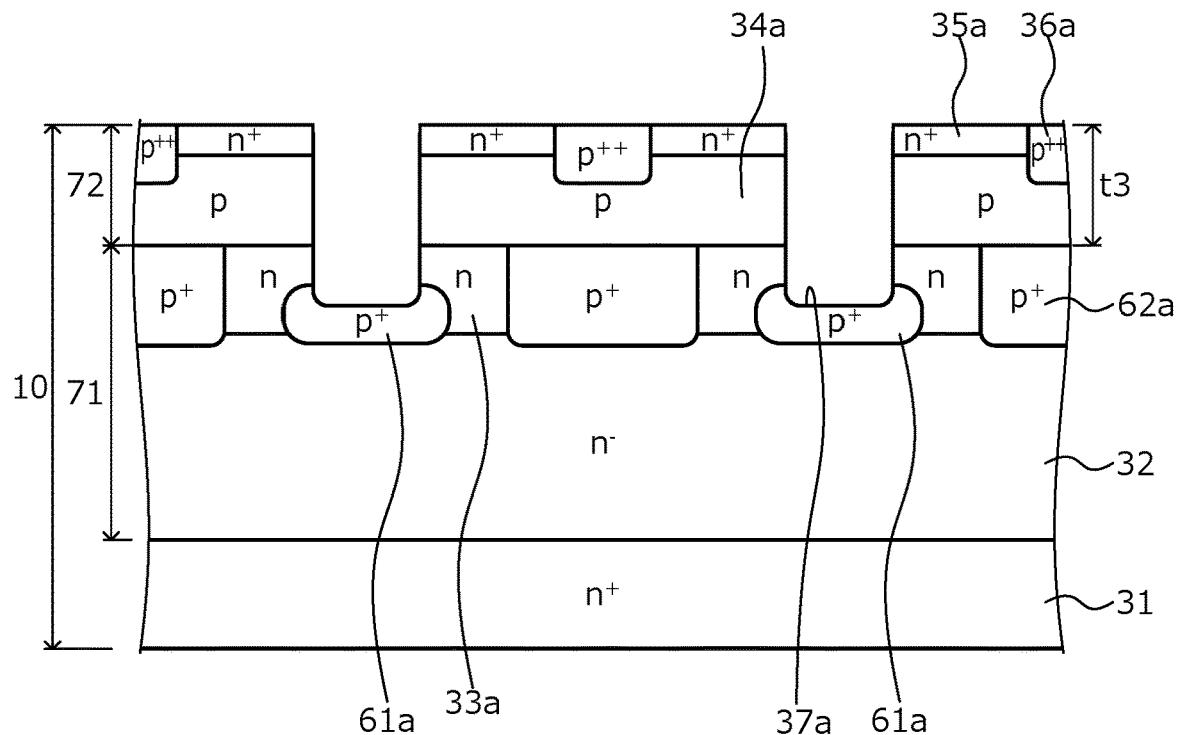
FIG. 15 is a cross-sectional view depicting a manufacturing state of the semiconductor chips mounted on the insulated substrate of the semiconductor circuit device according to the first embodiment.

Next, as depicted in FIG. 15, by photolithography and etching, the trenches 37a that penetrate through the n⁺-type source regions 35a and the p-type base region 34a from the front surface of the semiconductor wafer and reach the n-type current spreading regions 33a are formed facing the first p⁺-type regions 61a in the depth direction Z (vertical direction: refer to FIG. 4). The trenches 37a, for example, may reach the first p⁺-type regions 61a and terminate in the first p⁺-type regions 61a.

Figure 16:
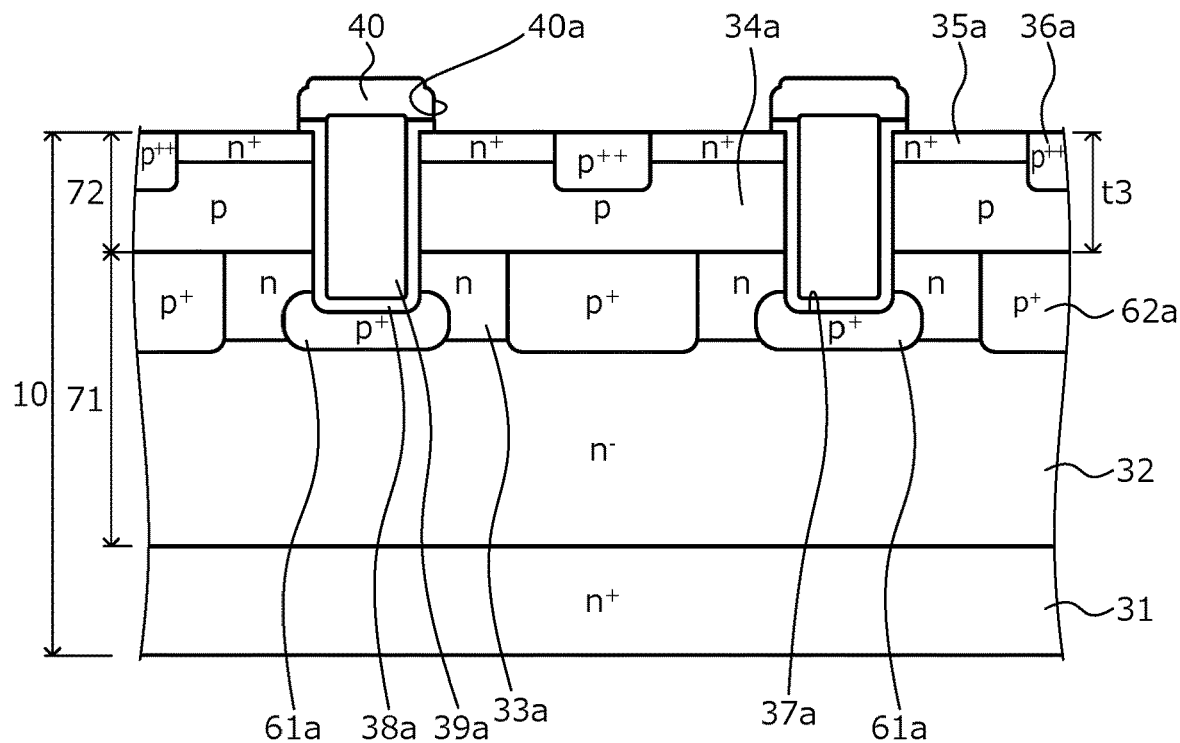
FIG. 16 is a cross-sectional view depicting a manufacturing state of the semiconductor chips mounted on the insulated substrate of the semiconductor circuit device according to the first embodiment.

Next, as depicted in FIG. 16, the gate insulating films 38a are formed along the front surface of the semiconductor wafer and inner walls of the trenches 37a. The gate insulating films 38a, for example, may be a thermal oxide film formed under an oxygen ($O_2$) atmosphere at temperature of about 1000 degrees C. or may be a deposited film formed by a method such as that for a high temperature oxide (HTO). Next, for example, a polysilicon layer doped with phosphorus is formed on the front surface of the semiconductor wafer so as to be embedded in the trenches 37a.

Next, the polysilicon layer is selectively removed, whereby portions of the polysilicon layer constituting the gate electrodes 39a are left in the trenches 37a. As described above, when the main semiconductor device elements 11 are formed, parts of all the device elements (high-function portions such as the current sensing portion 12, the temperature sensing portion 13, etc.: refer to FIGS. 4 and 5) fabricated on the semiconductor wafer are formed concurrently with the parts of the main semiconductor device elements 11. Next, the interlayer insulating film 40 is formed in an entire area of the front surface of the semiconductor wafer.

The main semiconductor device elements 11 are disposed in the p-type base region 34a of an island-like shape formed in surface regions of the semiconductor wafer at the front surface thereof; and by the pn junctions between the p-type base region 34a and the n⁻-type drift region 32, the main semiconductor device elements 11 are separate from all device elements fabricated on the semiconductor wafer. The current sensing portion 12 suffices to have the same structure as that of the main semiconductor device elements 11 and to be disposed in the p-type base region 34b of the island-like shape and formed in surface regions of the semiconductor wafer at the front surface thereof.

Further, as the temperature sensing portion 13, for example, a pn junction diode of the p-type polysilicon layer 73 and the n-type polysilicon layer 74 (refer to FIG. 4) is formed on the front surface of the semiconductor wafer. The p-type polysilicon layer 73 and the n-type polysilicon layer 74 are covered by the interlayer insulating film 75. Next, by photolithography and etching, the interlayer insulating film 40 and the gate insulating films 38a are selectively removed, whereby the first to the fourth contact holes 40a, 40b, 75a, 75b are formed.

In the first contact holes 40a, the n⁺-type source regions 35a and the p⁺⁺-type contact regions 36a of the main semiconductor device element 11 are exposed. In the second contact holes 40b, the n⁺-type source regions 35b and the p⁺⁺-type contact regions 36b of the current sensing portion 12 are exposed. In the third and the fourth contact holes 75a, 75b, the p-type polysilicon layer 73 and the n-type polysilicon layer 74 are exposed, respectively. Next, the interlayer insulating films 40, 75 are planarized (reflowed) by a heat treatment.

Next, the first TiN film 42a that covers only the interlayer insulating film 40 is formed. Next, the NiSi film 41a that is in ohmic contact with the front surface of the semiconductor wafer is formed on portions of the front surface of the semiconductor wafer exposed in the first contact holes 40a. Next, on the front surface of the semiconductor wafer, the first Ti film 43a, the second TiN film 44a, and the second Ti film 45a are sequentially stacked so as to cover the NiSi film 41a and the first TiN film 42a, whereby the barrier metal 46a is formed. Next, the source pad 21a is deposited on the second Ti film 45a.

Further, the NiSi film 41b and the barrier metal 46b having the same configurations as those of the NiSi film 41a and the barrier metal 46a, respectively, are formed in the second contact holes 40b, concurrently with the NiSi film 41a and the barrier metal 46a in the first contact holes 40a. Further, the OC pad 22, the anode pad 23a, and the cathode pad 23b having the same configuration as that of the source pad 21a are formed concurrently with the source pad 21a in the second to the fourth contact holes 40b, 75a, 75b, respectively.

Next, the drain electrode 51 that is in ohmic contact with the back surface of the semiconductor wafer is formed, and the drain pad (not depicted) is formed by sequentially stacking, for example, a Ti film, an Ni film, and a gold (Au) film on the surface of the drain electrode 51. Next, the first protective films 49a to 49c, 49e containing a polyimide is selectively formed on the front surface of the semiconductor wafer and in openings of the first protective films 49a to 49c, 49e, the different electrode pads 21a, 21b, 22, 23a, 23b are exposed, respectively. Next, a general pre-treatment plating process is performed.

Next, by a general plating process, the plating films 47a to 47e are formed in portions of the electrode pads 21a, 21b, 22, 23a, 23b exposed in the openings of the first protective films 49a to 49c, 49e. Next, a heat treatment (baking) for drying the plating films 47a to 47e is performed. Next, the second protective films 50a to 50c, 50e containing a polyimide are formed covering borders between the plating films 47a to 47e and the first protective films 49a to 49c, 49e.

Next, a heat treatment (curing) for enhancing the strength of the polyimide films (the first protective films 49a to 49c, 49e and the second protective films 50a to 50c, 50e) is performed. Next, the terminal pins 48a to 48e are bonded on the plating films 47a to 47e by respective solder layers (reference numeral 85 in FIG. 9). Next, the semiconductor wafer is diced (cut) into individual chips, whereby the semiconductor chips 10 on which the semiconductor devices 20 depicted in FIG. 1 to 5 are completed.

Layouts of the electrode pads of the front surfaces of the semiconductor chips 10 are determined according to the overall layout of the semiconductor chips 10 on the insulated substrate 80. Subsequently, by a general method, the semiconductor chips 10 are mounted on the insulated substrate 80, and the electrode pads of the front surfaces of the semiconductor chips 10 are electrically connected to the electrode pads of the printed circuit board 90, respectively. Thereafter, the parts on the insulated substrate 80 are sealed by the sealing material 89, whereby the semiconductor circuit device 100 depicted in FIGS. 6 to 9 is completed.

As described above, according to the first embodiment, the layouts of the electrode pads of the front surfaces of the semiconductor chips are determined according to the overall layout of the semiconductor chips mounted on the insulated substrate, and of all the semiconductor chips mounted on the insulated substrate, the configuration of at least one of the semiconductor chips is different. As a result, the semiconductor chips may be mounted on the insulated substrate so that the length of the wiring connecting the main semiconductor device elements to one another in parallel is as short as possible, or so that due to the wiring, the resistance components and/or the reactance components between electrode pads of the same type on the semiconductor chips connected in parallel become uniform, or so that both of these conditions are satisfied.

As a result, when the semiconductor circuit device turns OFF, variation of the gate threshold voltage for each of the main semiconductor device elements fabricated on the semiconductor chips may be suppressed and the voltage waveform of the gate voltage of the semiconductor circuit device may be set to be resistant to oscillation. As a result, the rising edge of the voltage waveform of the drain-source voltage when the main semiconductor device elements of the semiconductor chips turn OFF may be set to be substantially the same and the voltage waveform of the drain-source voltage of the semiconductor circuit device may be set to be resistant to oscillation. Therefore, oscillation of the current waveform of the drain-source current when the semiconductor circuit device turns OFF may be suppressed.

Figure 17:
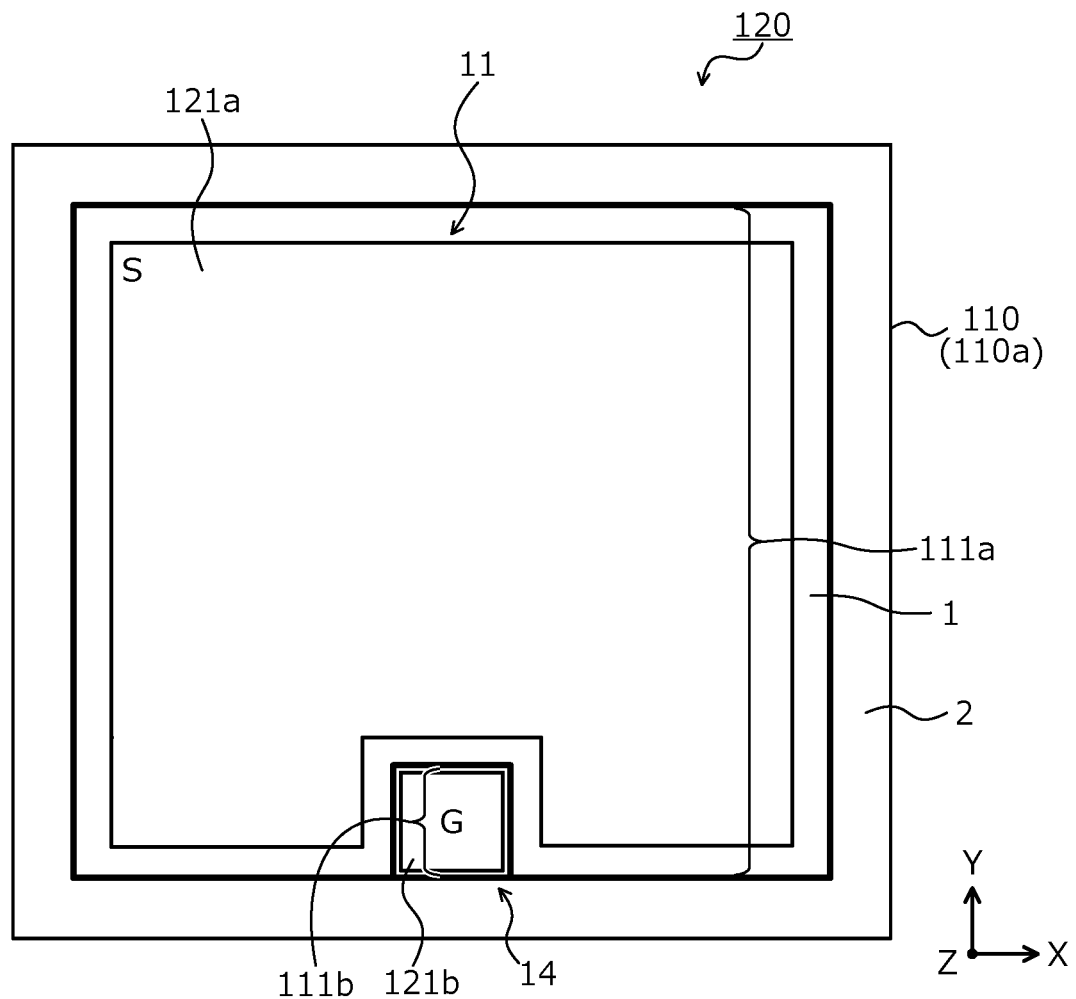
FIG. 17 is a plan view depicting an example of a layout when the semiconductor chips mounted on the insulated substrate of a semiconductor circuit device according to a second embodiment are viewed from a front side.
Figure 18:
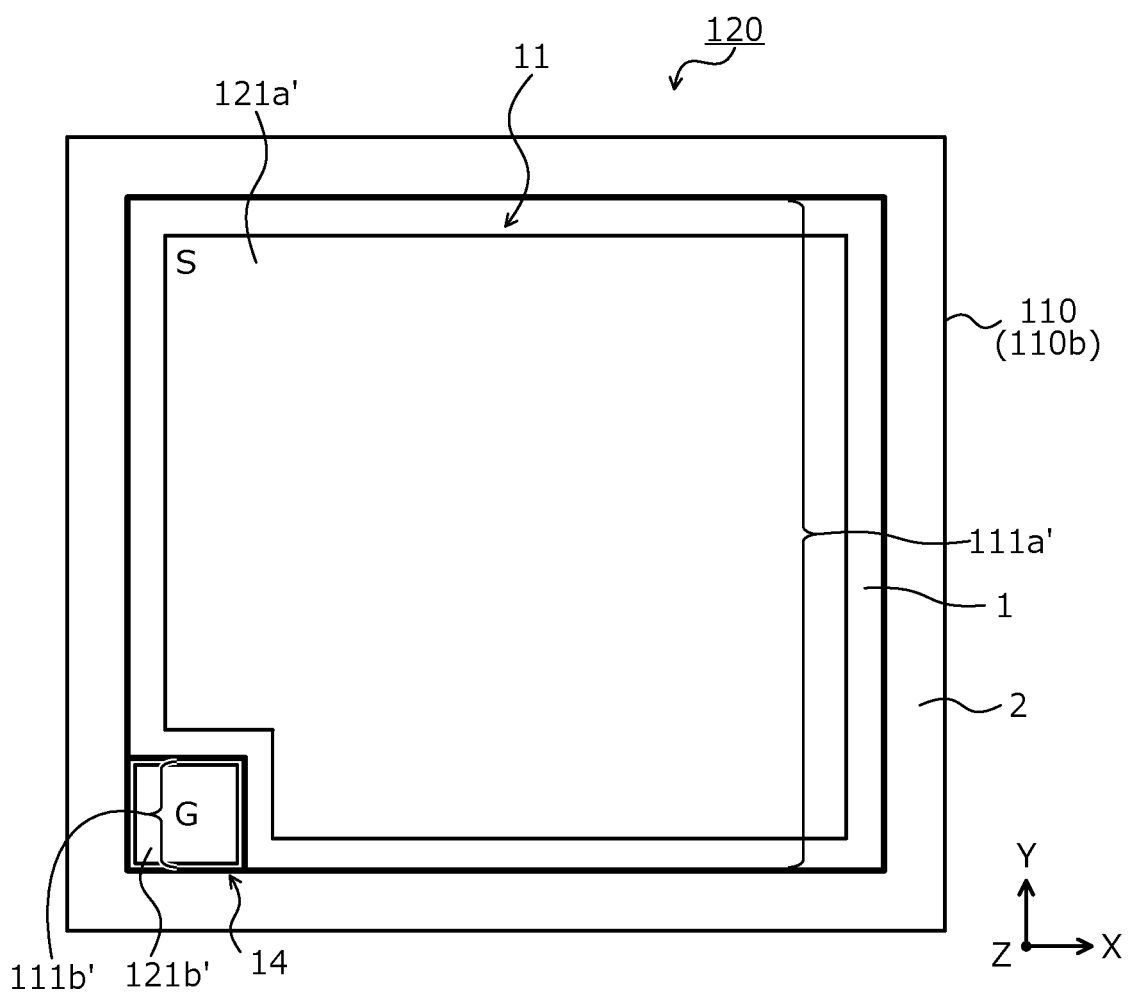
FIG. 18 is a plan view depicting an example of a layout when the semiconductor chips mounted on the insulated substrate of a semiconductor circuit device according to a second embodiment are viewed from a front side.

Next, a semiconductor circuit device according to a second embodiment is described. FIGS. 17 and 18 are plan views depicting examples of layouts when the semiconductor chips mounted on the insulated substrate of the semiconductor circuit device according to the second embodiment are viewed from the front side. Semiconductor chips 120 mounted on the insulated substrate of the semiconductor circuit device according to the second embodiment differ from the semiconductor chips 10 (refer to FIGS. 1 to 3) mounted on the insulated substrate of the semiconductor circuit device according to the first embodiment in that in a single one of the semiconductor chips 10, in the active region 1 thereof, only the main semiconductor device elements 11 are provided.

The semiconductor chips 120 mounted on the insulated substrate of the semiconductor circuit device according to the second embodiment have only a gate pad 121b in a main non-operating region 111b. Therefore, the surface area of the main non-operating region 1b is reduced compared to an instance in which the high-function portions constituting the circuit portions for protecting and controlling the main semiconductor device elements 11 are disposed on the same semiconductor chip 120 having the main semiconductor device elements 11. In this manner, in an instance in which an electrode pad (herein, the gate pad 121b) is disposed on a portion of the front surface of the semiconductor chip 120, the first embodiment described above is applicable.

Of the semiconductor chips 120, a layout of electrode pads (source pads 121a, 121a' and the gate pads 121b, 121b') of the front surface of the semiconductor chip 120 is different for at least one of the semiconductor chips 120 and thus, at least 2 patterns are present (refer to FIGS. 17 and 18). Main effective regions 111a, 111a', for example, may have a substantially rectangular shape in which a portion thereof is recessed inwardly in a plan view. A shape of the source pads 121a, 121a' in plan views thereof, for example, are substantially the same as the shapes of the main effective regions 111a, 111a' in plan views thereof.

The main non-operating regions 111b, 111b', for example, are disposed in the recessed portions of the main effective regions 111a, 111a'. The main non-operating region 111b may be disposed at one side of the substantially rectangular shaped border between the main non-operating region 111b and the edge termination region 2, and may have a substantially rectangular shape that surrounds three sides of the main effective regions 111a in the plan view (FIG. 17). The main non-operating region 111b' may be disposed at one vertex of the substantially rectangular shaped border between the main non-operating region 111b' and the edge termination region 2, and may have a substantially rectangular shape that surrounds two sides of the main effective regions 111a' in the plan view (FIG. 18).

A cross-sectional view of the structure of the main effective regions 111a, 111a' of the semiconductor chips 120 along cutting line X1-X2 is the same as the cross-sectional view of the structure in FIG. 4. A cross-sectional view of the structure of the main non-operating regions 111b, 111b' (the gate pad portions 14) of the semiconductor chips 120 along cutting line Y2-Y3 is the same as the cross-sectional view of the structure in FIG. 5. Other than the layouts of the electrode pads of the front surfaces of the semiconductor chips 120, configuration of the semiconductor circuit device according to the second embodiment (mounting of the semiconductor chips 120 on the insulated substrate) is the same as that of the semiconductor circuit device 100 according to the first embodiment (refer to FIGS. 6 to 9).

As described above, according to the second embodiment, in an instance in which at least two electrode pads are disposed in a predetermined layout on the front surface of the semiconductor chip mounted on the insulated substrate, effects similar to those of the first embodiment may be obtained.

Figure 19:
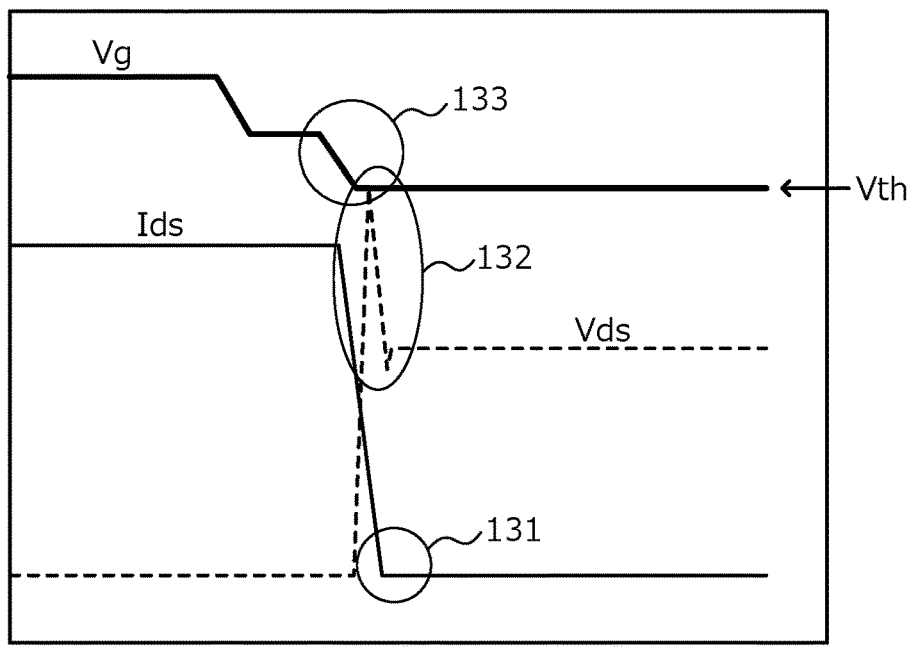
FIG. 19 is a characteristics diagram depicting a voltage waveform and a current waveform during turn OFF of an example.
Figure 20:
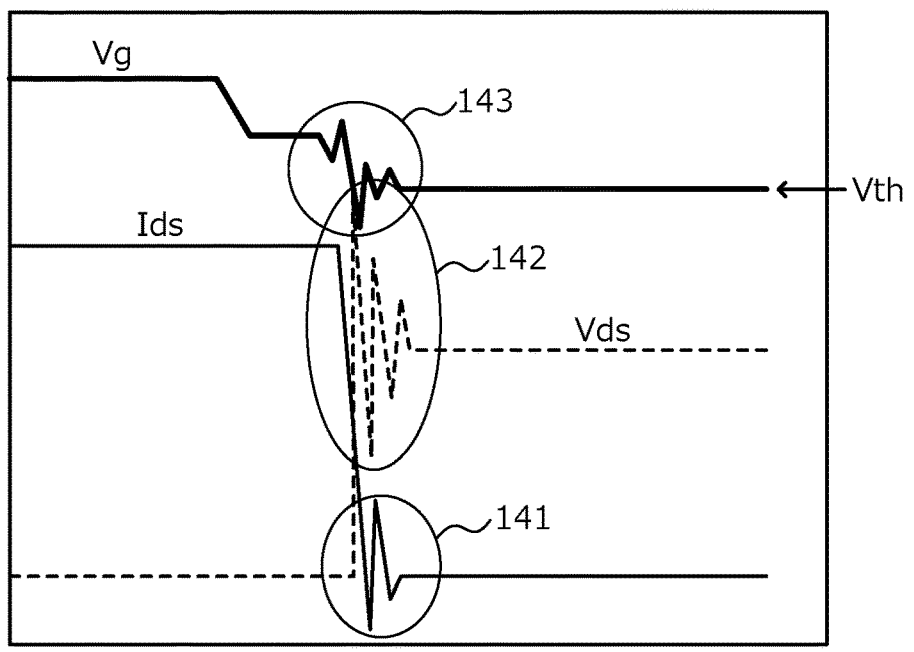
FIG. 20 is a characteristics diagram depicting a voltage waveform and a current waveform during turn OFF of a conventional example.

The current waveform of the semiconductor circuit device 100 according to the first embodiment described above (refer to FIGS. 1 to 10) was verified. FIG. 19 is a characteristics diagram depicting the voltage waveform and the current waveform during turn OFF of an example. FIG. 20 is a characteristics diagram depicting the voltage waveform and the current waveform during turn OFF of a conventional example. The current waveform 131 of the drain-source current Ids, the voltage waveform 132 of the drain-source voltage Vds, and the voltage waveform 133 of the gate voltage Vg during turn OFF of the semiconductor circuit device 100 according to the first embodiment described above (hereinafter, "example", refer to FIGS. 1, 2, 4, 5, 6, 9, and 10) are depicted in FIG. 19.

For comparison, the current waveform 141 of the drain-source current Ids, the voltage waveform 142 of the drain-source voltage Vds, and the voltage waveform 143 of the gate voltage Vg during turn OFF of the conventional semiconductor circuit device 200 (hereinafter, "conventional example", refer to FIGS. 21 and 22) are depicted in FIG. 20. In the conventional example, the overall layout of all the semiconductor chips 210 mounted on the insulated substrate 220 and the layout of the electrode pads (the source pad 211a, the gate pad 211b, the OC pad 212, the anode pad 213a, and the cathode pad 213b) of the front surface of each of the semiconductor chips 210 differ from those of the example.

From the results depicted in FIG. 19, it was confirmed that in the example, during turn OFF, variation of the gate threshold voltage Vth for each of the main semiconductor device elements 11 fabricated on the semiconductor chips 10 could be suppressed, and the voltage waveform 133 of the gate voltage Vg of the semiconductor circuit device 100 was resistant to oscillation. A reason surmised for this is that in the example, the length of the gate wiring 19 (the wiring 96, 96', refer to FIGS. 6 and 10) is shorter than the length of the wiring 234 of the conventional example (refer to FIG. 21) and the resistance components and/or the reactance components between the gate pads 21b of the semiconductor chips 10 connected in parallel to each other are substantially uniform.

Thus, it was confirmed that the rising edges of the voltage waveforms of the drain-source voltage Vds during turn OFF in the main semiconductor device elements 11 of the example could be set to be substantially the same and the drain potentials at the connection points 100a to 100d (refer to FIG. 10) between the main semiconductor device elements 11 and the drain wiring 18 could be set to be substantially the same. Thus, it was confirmed that the voltage waveform 132 of the drain-source voltage Vds of the example (the semiconductor circuit device 100) could be set to be resistant to oscillation and oscillation of the current waveform 131 of the drain-source current Ids during turn OFF could be suppressed.

On the other hand, from the results depicted in FIG. 20, oscillation of the current waveform 141 of the drain-source current Ids, oscillation of the voltage waveform 142 of the drain-source voltage Vds, and oscillation of the voltage waveform 143 of the gate voltage Vg during turn OFF were confirmed for the conventional example (the semiconductor circuit device 200). In the conventional example, the resistance components and/or the reactance components of the wiring 234 have an adverse effect; the gate threshold voltage Vth varies for each of the main semiconductor device elements fabricated on the semiconductor chips 210; and the rising edges of the voltage waveform of the drain-source voltage Vds for each of the main semiconductor device elements come to differ, whereby the voltage waveform 142 of the drain-source voltage Vds of the conventional example overall easily oscillates.

In the foregoing, the present invention is not limited to the embodiments described above and various modifications within a range not departing from the spirit of the invention are possible. The present invention is further applicable in an instance in which a wide band gap semiconductor other than silicon carbide or silicon is used as a semiconductor material instead of silicon carbide as a semiconductor material. Further, the present invention is similarly implemented when the conductivity types (n-type, p-type) are reversed.

According to the invention described above, during turn OFF of the semiconductor circuit device, variation of the gate threshold voltage for each of main semiconductor device elements fabricated on the semiconductor chips may be suppressed and the voltage waveform of the gate voltage of the semiconductor circuit device may be set to be resistant to oscillation. As a result, in the main semiconductor device elements of the semiconductor chips, the rising edges of the voltage waveforms of the drain-source voltage during turn OFF may set to be substantially the same and the voltage waveform of the drain-source voltage of the semiconductor circuit device may be set to be resistant to oscillation.

The semiconductor circuit device according to the present invention achieves an effect in that oscillation of the current waveform during turn OFF of the semiconductor circuit device in which the semiconductor devices fabricated on the semiconductor chips are connected in parallel to one another may be suppressed.

In this manner, the semiconductor device according to the present invention is useful for semiconductor circuit devices in which multiple (at least 2) semiconductor chips are mounted on a mounting substrate and on these semiconductor chips, semiconductor devices of a same current capacity are fabricated and connected in parallel to one another.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor circuit device, comprising:
   a first substrate;
   a plurality of first pad sets;
   a plurality of semiconductor chips including a first semiconductor chip and a second semiconductor chip, each of the plurality of semiconductor chips including one first pad set of the plurality of first pad sets, being bonded to the first substrate, separate from one another and containing a semiconductor having a band gap wider than that of silicon, each semiconductor chip further having:
   a plurality of semiconductor device elements of different types, and
   the one first pad set disposed on a front surface of said each semiconductor chip, and including a plurality of first electrode pads of different types, the plurality of first electrode pads being disposed separately from one another, each of the plurality of first electrode pads in the one first pad set being electrically connected to one of the plurality of first electrode pads that are of the same type in each other one first pad set on the rest of the plurality of semiconductor chips, the different types of the plurality of first electrode pads in the one first pad set corresponding to the different types of the plurality of semiconductor device elements;

a second substrate that includes one second pad set including a plurality of second electrode pads of different types that respectively are the same as respective ones of the different types of the plurality of first electrode pads of one of the plurality of first pad sets; and a plurality of metal members, each of the first electrode pads on the first substrate that are of the same type being connected in parallel to a second electrode pad among the plurality of second electrode pads of said same type on the second substrate via one of the plurality of metal members, wherein the plurality of first electrode pads of the one first pad set on the first semiconductor chip is arranged on the front surface of the first semiconductor chip in a first pad layout that is different in a plan view of the semiconductor circuit device from a second pad layout in which the plurality of first electrode pads of the one first pad set is arranged on the front surface of the second semiconductor chip, values of resistance components and/or values of reactance components are the same between each of the first electrode pads that are of the same type on the first substrate and a second electrode pad of said same type among the plurality of second electrode pads on the second substrate.

2. The semiconductor circuit device according to claim 1, wherein distances are the same between each of the first electrode pads that are of the same type on the first substrate and the second electrode pad of said same type among the plurality of second electrode pads on the second substrate.

3. The semiconductor circuit device according to claim 2, wherein the metal members are metal wires.

4. The semiconductor circuit device according to claim 1, further wherein the second substrate is disposed above the first substrate, and faces the front surface of said each semiconductor chip in a thickness direction of the first substrate, the metal members include:
a plurality of terminal pins, each of the plurality of terminal pins leading out a potential of one of the plurality of first electrode pads of a respective one of the plurality of first pad sets, and a plurality of metal wirings formed on the second substrate, and the terminal pins that lead out the potential of the first electrode pads that are of the same type are connected to one another via one of the plurality of metal wirings.

5. The semiconductor circuit device according to claim 4, further comprising a resistor formed on the second substrate and being electrically connected to one of the plurality of metal wirings.

6. The semiconductor circuit device according to claim 4, wherein the reactance component between a first electrode pad on the first substrate and a second electrode pad on the second substrate that are of the same type includes a pin reactance component, two or more of the plurality of terminal pins are bonded to the first electrode pads on the first substrate that are of the same type, and at least one of the two or more of the plurality of terminal pins bonded to the electrode pads has a bent portion to have the pin reactance component included in the reactance component.

7. The semiconductor circuit device according to claim 1, wherein the plurality of first electrode pads and the plurality of second electrode pads each include more than two electrode pads of different types.

* * * * *